United States Patent [19]

Hedman et al.

[11] Patent Number: 5,517,040
[45] Date of Patent: May 14, 1996

[54] PERSONALIZABLE SEMICONDUCTOR CHIPS FOR ANALOG AND ANALOG/DIGITAL CIRCUITS

[75] Inventors: Robert L. Hedman; Gordon G. Koehler; Karl L. Ladin; John T. Trnka, all of Rochester, Minn.

[73] Assignee: International Business Machines Corporation, Armonk, N.Y.

[21] Appl. No.: 782,773

[22] Filed: Oct. 21, 1991

Related U.S. Application Data

[63] Continuation of Ser. No. 363,319, Jun. 7, 1989, abandoned, which is a continuation of Ser. No. 44,399, Apr. 30, 1987, abandoned.

[51] Int. Cl.⁶ .................................................. H01L 27/118
[52] U.S. Cl. ................................................................ 257/205
[58] Field of Search ................................ 357/44, 45, 51; 257/205

[56] References Cited

U.S. PATENT DOCUMENTS

| | | | |
|---|---|---|---|
| T101,804 | 5/1982 | Balyoz et al. | 357/45 |
| 3,484,932 | 12/1969 | Cook, Jr. | 352/51 |
| 3,558,992 | 1/1971 | Heuner et al. | 357/51 |
| 4,006,492 | 2/1977 | Eichelberger et al. | 357/68 |
| 4,016,483 | 4/1977 | Rudin | 357/51 |
| 4,636,831 | 1/1987 | Ono et al. | 357/51 |
| 4,641,108 | 2/1987 | Gill, Jr. | 357/45 |

FOREIGN PATENT DOCUMENTS 0074804  3/1983  European Pat. Off. ........ H01L 23/52

*Primary Examiner*—William D. Larkins
*Attorney, Agent, or Firm*—J. Michael Anglin; Roy W. Truelson

[57] ABSTRACT

A computer converts a description of an analog circuit to a physical representation in terms of devices on a personalizable chip. The devices are placed and wired automatically for fabrication of the chip. Descriptions of resistors in the circuit are expanded by wiring multiple contacts of one or more actual resistor devices on the chip. The chip uses multiple rows of devices arranged in columns; each row contains multiple transistor and resistor devices.

6 Claims, 9 Drawing Sheets

PERSONALIZABLE SEMICONDUCTOR CHIPS FOR ANALOG AND ANALOG/DIGITAL CIRCUITS

This is a continuation of Ser. No. 07/363,319 filed Jun. 7, 1989, now abandoned, which was a continuation of co-pending application Ser. No. 044,399 filed on Apr. 30, 1987, now abandoned.

BACKGROUND OF THE INVENTION

The present invention relates to the fabrication of semiconductor integrated circuits, and more particularly concerns methods and device structures for implementing large analog or analog/digital circuits in a format known as a master slice, master image, ASIC (application-specific integrated circuit), standard-cell array, semicustom or personalizable chip.

The integration of large-scale analog circuits has trailed considerably behind that of large-scale digital circuits. Automated methods and tools have been available for translating functional or schematic logic representations of a digital circuit into actual physical logic gates and their interconnection wiring on a semiconductor chip or die. Analog circuits, however, are still generally implemented by hand: determining the relative placement of physical devices or components, the routing of the wiring between the devices, wiring between devices and input/output (I/O) pads on the chip, wiring power busses and connecting them to the appropriate circuit devices. These tasks usually proceed iteratively; the design time and errors tend to grow exponentially with the size of the overall circuit.

The conventional methods which begin to improve on this situation mimic the methods developed for digital circuits. That is, preconstructed analog subcircuits are placed on a chip in the same way that multi-device logic gates are placed on a chip, then wired with automatic wiring programs.

There are several problems with these methods. Analog circuits cannot be characterized into a small number of primitive "logic gate" type circuits; a great variety of elementary circuits should be available for adequate flexibility in overall function. A single component at the logical or schematic level may require a personalized value or multiple devices. A single logical resistance, for example, may require part of a physical device or a number of physical resistor devices in order to implement the desired value of resistance. Furthermore, conventional analog master slice chip layouts do not have an organization that is compatible with existing placement and wiring techniques.

SUMMARY OF THE INVENTION

The present invention provides an automated method for converting a logical description of an analog circuit into a physical implementation on a semiconductor chip. It includes a method for expanding logical resistor descriptions to configured single or multiple physical devices, and a novel chip configuration for facilitating the methods.

The overall method of the invention uses an automatic data processor for capturing data representing the logical description of an analog circuit, converting it to data representing a device-level physical description in terms of devices on a particular chip, placing devices in the physical description at particular locations on the chip, wiring conductors for interconnecting the devices according to the physical description; the chip is then fabricated in accordance with the data specifying the device and wiring locations. Converting the description of logical resistance values includes placing many resistor devices on a chip, defining a number of contacts along the length of each resistor device, determining a number of logical resistance values possible in each device, and connecting together certain ones of the contacts to achieve overall resistance values most closely approximating the desired logical values. The chip layout for accommodating this technique has a number of "bricks" of physical devices lying side by side in one or more columns. Each brick has multiple resistor devices and multiple transistor devices disposed in a line or row in one direction.

The present invention allows the large-scale integration of analog circuits with automatic placement and wiring (APW) tools similar to those developed for digital-circuit integration. Yet the circuit designs remain flexible down to the level of individual transistor and resistor devices. The invention greatly reduces errors and reduces design time. As will be seen in the following description, the way in which power busses are specified and wired increases the utility of the chip and renders inter-device wiring easier. The automatic use of multiple resistor devices to implement some unitary logical resistances increases the variety of circuits which can be implemented. The arrangement of brick components in the direction of current flow simplifies interconnection wiring. Many other advantages of the invention, as well as modifications within the spirit of the invention, will be appreciated by those skilled in the art from the following detailed description of a preferred embodiment.

DESCRIPTION OF A PREFERRED EMBODIMENT

Figure 1:
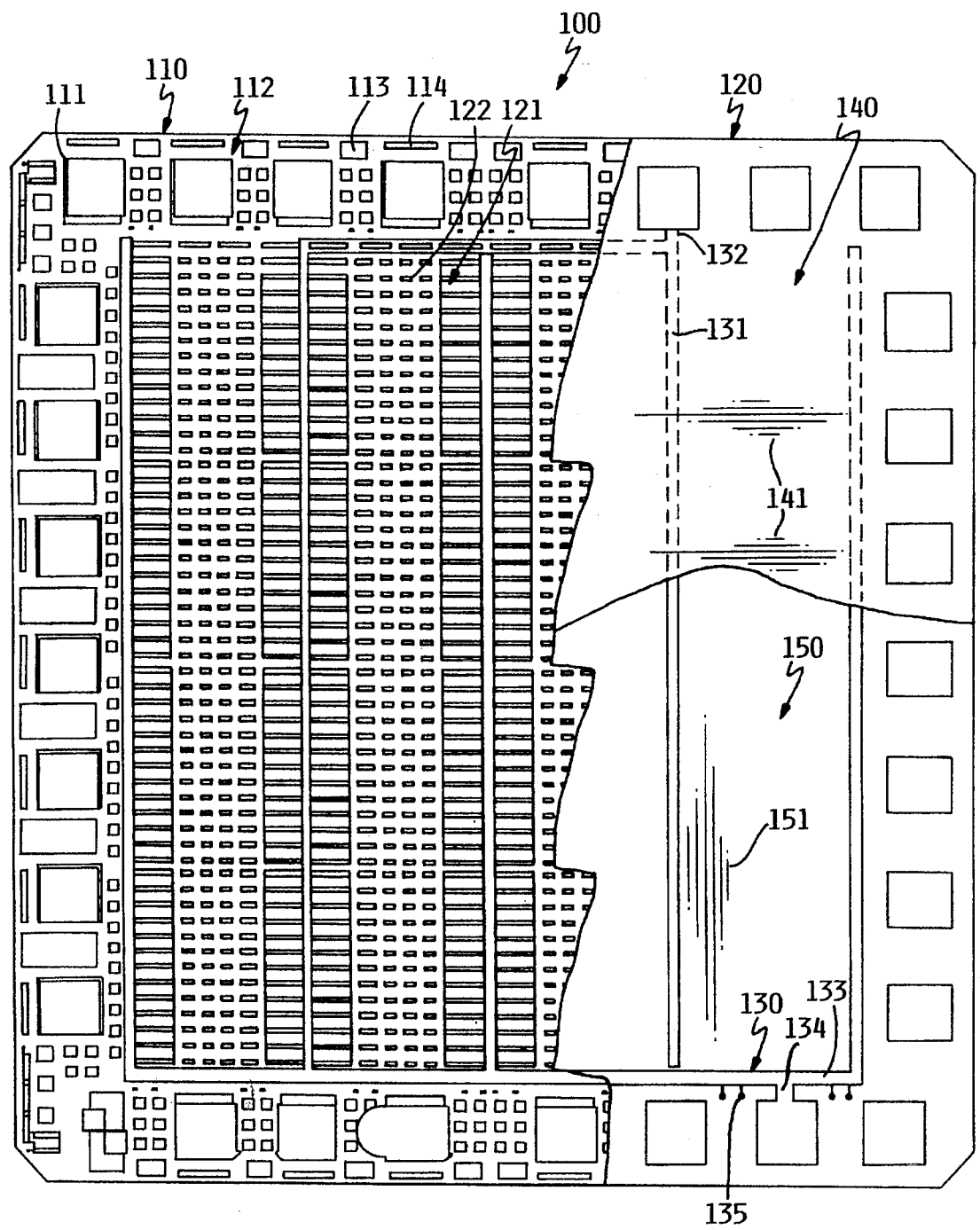
FIG. 1 shows a portion of a semiconductor chip according to the present invention.

FIG. 1 is a top view of a semiconductor chip 100, partially cut away to show the configuration of several layers. A peripheral area 110 contains areas 111 for conventional (I/O) pads and circuit devices 112 for connecting the circuits on chip 100 to other components of an overall system; such devices may include power transistors 113 and large-value resistors 114. The interior area 120 holds multiple columns 121 of circuit bricks 122. The bricks 122 are disposed side by side in each column 121, so that their lengths lie perpendicular to the length of the column. The columns in turn are disposed side by side, so that individual bricks in one column lie end to end with respect to corresponding bricks in adjacent columns. The component order of the bricks is mirrored in adjacent columns, as explained in conjunction with FIG. 2.

A layer of first metal 140 overlies the silicon layer depicted at the left hand side of FIG. 1. Wiring strips or conductors 141, fabricated by any conventional technique, all lie substantially in the direction of the length of the bricks 122. These first-metal wiring conductors serve to personalize the functions of the devices in the bricks by interconnecting certain desired contacts within and among the bricks. Contacts are formed by conventional vias in an insulating layer (not shown) overlying the silicon layer in which the devices are embedded. Others of the strips 141 connect contacts in the bricks with certain I/O contacts 142, as specified in the circuit schematic. Contacts 142 are relatively large areas in the first metal layer at locations specified by the chip description.

A layer of second metal 150 overlies layer 140 and is electrically insulated therefrom. Conventionally fabricated conductors or wiring strips 151 connect wiring strips 141 to each other through conventional vias in the insulating layer (not shown) between the two metal layers. Wiring strips 151 run substantially along the direction of the length of columns 121, that is to say, perpendicular to the length direction of the individual bricks in the column. Some of the second-metal conductors may connect directly to contacts in bricks 122 through stacked vias (not shown) through both of the aforementioned insulating layers. I/O pads 142 also have vias in the insulating layer immediately under layer 150, so that the pads also have a layer of second metal. None of the wires 151 connect directly to I/O contacts 142 in the particular technology of this embodiment, although they could do so in other implementation technologies if desired.

A structure 130 comprising power busses 131 and 133 is disposed between each column 121 and the next. In this technology, the busses are actually implemented in the second metal layer 150; their locations with respect to the first-metal and brick levels are shown by diagonal striping. Bus 131 carries a supply voltage to one side of each column 121: the right side of the leftmost column, the left side of the next column, and so forth. With a total of four columns on the chip, it has the shape of a Greek letter Pi. A short ligature 132 connects this bus to one or more of the I/O contacts. Bus 133 carries a ground potential to the other side of each column 121: the left side of the leftmost column, the right side of the next column, etc. The overall shape of bus 133 is that of the Cyrillic letter Sha. A short ligature 134 connects ground bus 133 to one or more I/O pads. Also, short wires such as 135 couple ground voltage to the lowermost substrate layer as a chip bias voltage. Such connections are conventional for back-biasing the substrate in order to electrically isolate the devices from each other. As will be described later, however, connections to the power busses and chip-bias points are not fixed, predetermined patterns independent of the device wiring; they are constructed in the same steps as the signal wiring, in order to minimize blockages.

Figure 2:
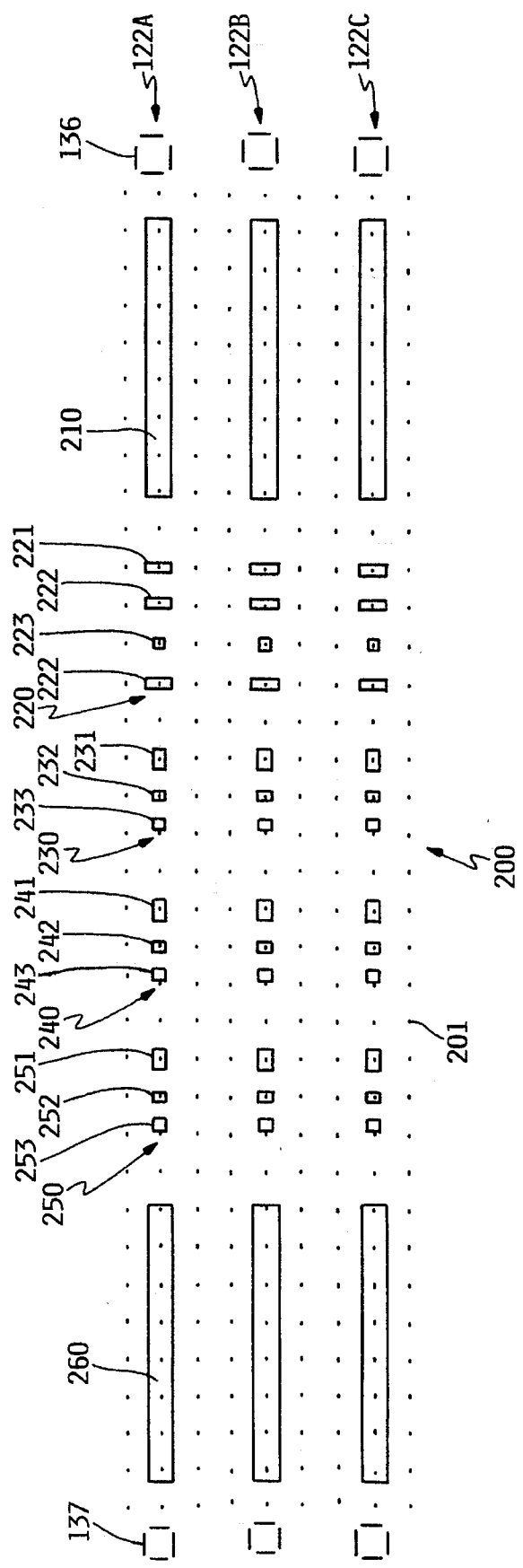
FIG. 2 shows a number of circuit bricks of FIG. 1.

FIG. 2 shows a small group 200 of circuit bricks 122 taken from a single column 121, FIG. 1. Dots 201 are not physically present; they demonstrate how the contacts both within each brick and from brick to brick can be laid out in a rectangular grid of points. The horizontal and vertical intervals between grid points may be the same or different. Contacts on the resistor devices may or may not lie on the grid points, as will be described in connection with FIG. 3.

Each brick contains a linear resistor device 210 at one end, next to a branch of the positive supply power bus 131, FIG. 1. Device 210 is fabricated conventionally so as to provide a selectable electrical resistance. Next in the brick is a PNP bipolar transistor device 220 having base, collector, and emitter contacts 221,222, and 223 respectively. Three NPN transistor devices 230, 240, and 250 are disposed in a line following the PNP device. Their collector contacts are 231,241, and 251, respectively. Their base contacts are 232, 242, and 252; and their emitter contacts are 233, 243, and 253. Last, another linear resistor device 260 is disposed in the line, next to device 250. One end of device 260 lies adjacent the ground bus 133, FIG. 1. The order of the devices 210–260 is reversed in adjacent columns 121, so as to preserve the polarity of the transistor devices with respect to the polarities of busses 131 and 133. All of the devices 210–260 may be fabricated in any conventional manner; the resistor devices may have about 500 ohms per square, and are shaped to provide a maximum resistance of about 4 Kohms in each device. Other technologies may use different values.

The brick configuration of FIG. 2 orders devices 210–260 in the order of current flow between the voltage busses or rails 130. Although few circuits will actually connect in a straight line between these rails, the overall complexity of the chip wiring is greatly decreased thereby. For example, many circuit elements have a resistance connected directly to a positive power bus and to the emitter of a PNP transistor, and a resistance connected to a ground or negative power bus and the emitter of an NPN transistor. Frequently, such resistor/transistor combinations serve as current sources or mirrors coupled to NPN transistors such as 230 and 240 in a signal path. Any of the transistor devices may, of course, be wired to function as a diode.

The small dashed squares 136 and 137 indicate connection points to the bus structure 130, FIG. 1. For the particular column 121 illustrated in FIG. 2, squares 136 define an arm of positive supply bus 131, while squares 137 define an arm of ground bus 133. Just as the contacts 221–223, for example, locate the termini of wires to transistor 220, the locations 136 define a "device" whose "contacts" will later be all wired together to form the bus 131. In addition, each square 136 defines a location which can be connected to any device contact requiring a connection to the positive supply bus 131. Since all the squares are in the same net (discussed under FIGS. 8 and 9), a wiring program is free to select whichever contact 136 is nearest the device contact to be connected to the bus. Locations 137 for the ground bus 133 are similar.

Figure 3:
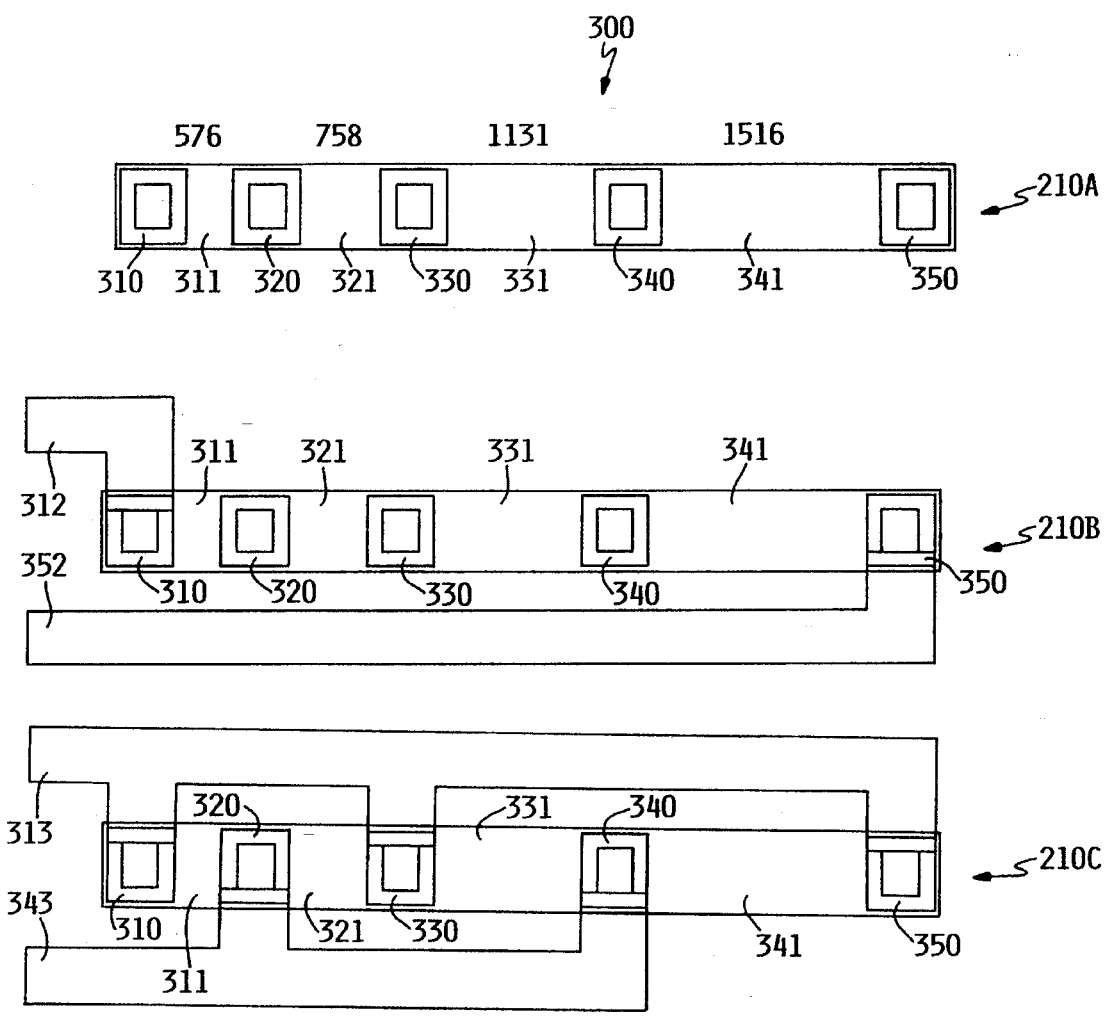
FIG. 3 shows one form of resistor device useful in the bricks of FIG. 2.

FIG. 3 shows a group 300 of resistor devices 210 (or 260), FIG. 2, from circuit bricks 122, FIG. 1. Resistor 210A is an unconnected bar showing five contacts 310, 320, 330, 340, and 350 at spaced locations along its length. These locations provide segments 311,321,331, and 341 between successive pairs of contacts. The segments may then be connected to other circuit devices at any two contacts, providing an effective resistance of any one segment, or of any group of segments in series. Certain contacts may also be connected to other contacts on the same device, so as to connect segments in parallel for obtaining other effective resistances from the overall resistor device.

Resistor 210B shows a configuration for maximum resistance from a single device. Conductive strips 312 and 352 connect contacts 310 and 350 to other devices (not shown) for a resistance of approximately 4,000 ohms (4 Kohms). Resistor 210C shows a configuration for minimum resistance. Conductor 313 connects to every other contact, 310, 330, and 350. Conductor 343 connects to the remaining contacts, 320 and 340, placing all the segments 311, 321, 331, and 341 in parallel, for a resistance of about 200 ohms. To achieve total resistances of more than the maximum available from a single device, multiple devices are connected together. For example, connecting conductor 352 to conductor 313 gives an overall resistance of about 4.2 Kohms between conductors 312 and 343. Other multiple-device connections may easily be seen to provide resistances lower than the minimum of a single device, values intermediate those available on one device, and/or greater power dissipation if required.

Figure 4:
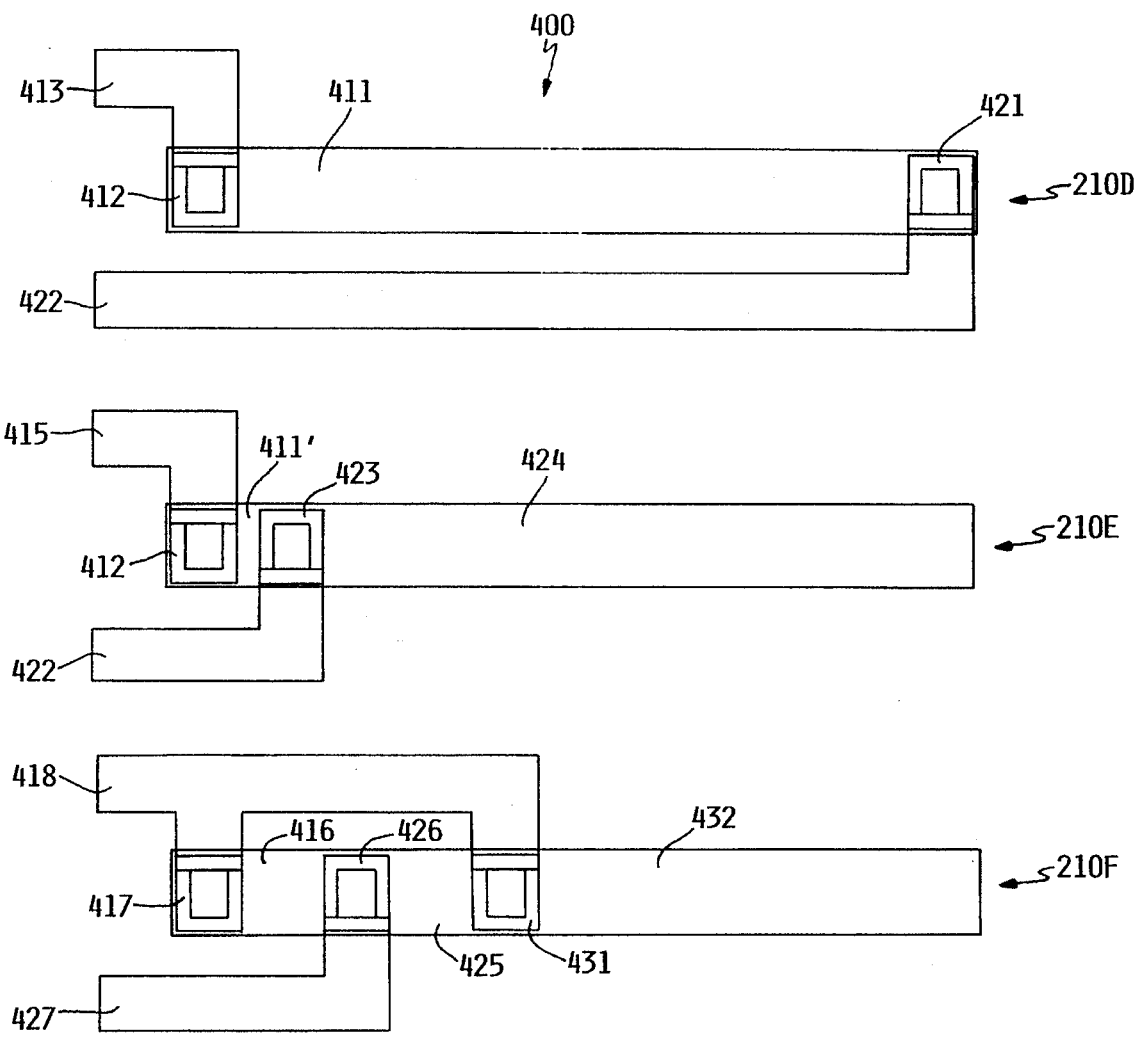
FIG. 4 shows another form of resistor device useful in the bricks of FIG. 2.

FIG. 4 shows a group 400 of resistor devices 210 (or 260), FIG. 2, from circuit bricks 122, FIG. 1. These resistors 210D, 210E, and 210F, have contacts placed at variable locations, depending upon the desired resistance value. Resistor 210D has a single segment 411, with contacts 412,421 at each end. Thus, the resistance between the conductor strips 413 and 422 is the maximum of 4 Kohms for a single resistor device. Resistor 210E is configured for a minimum resistance of about 450 ohms. Contacts 414 and 423 are located as close together as possible under the groundrules of the circuit technology. Segment 424 is unused. Again, multiple devices could be connected together, as by coupling conductors 422 and 415 together, to achieve additional resistance values.

Resistor 210F shows multiple segments 416 and 425, defined by contacts 417,426, and 431 located at any desired points along the length of the resistor. These segments are connected in parallel by conductors 418 and 427 to achieve resistances less than that obtainable with resistor 210E. The desired resistance is multiplied by the number of segments 416,425, etc. The result is used to determine the spacing of contact 417 with respect to 426, and the spacing of 426 with respect to 431, etc. Any residual segment, such as 432, remains unconnected. Parallel connections can also be used to increase current and power capabilities of resistor 210F.

Figure 5:
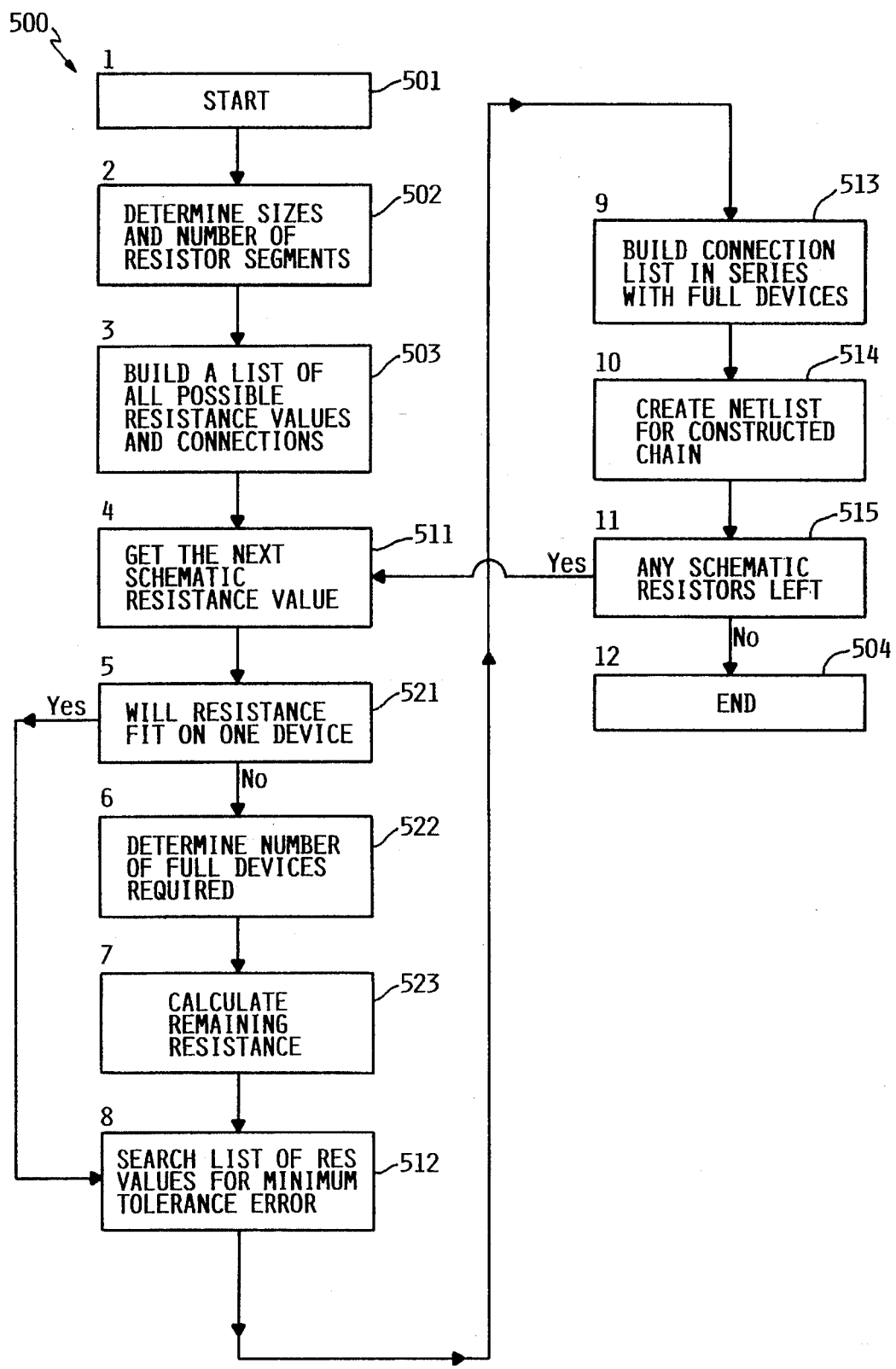
FIG. 5 is a flowchart of a method according to the invention for configuring the resistor devices of FIG. 3.

FIG. 5 shows a method of wiring fixed-contact resistor devices such as 210A, 210B, and 210C, FIG. 3, to achieve resistance values as specified by the logical description of the overall circuit to be implemented on the chip. A "logical" resistance is a specification of a certain value of resistance as a functional unit in the overall circuit; this logical resistance must be implemented as one or more physical resistor devices wired so as to approximate within a given tolerance the value of the desired logical resistance. Flowchart 500 starts at block 501. The first task, in block 502, is to specify as parameters the number and sizes (i.e., resistance values) of all the segments for each physical resistor device; normally every device will be the same. FIG. 6, discussed below, shows the considerations in selecting these values.

Next, block 503 builds a list containing all of the possible resistance values achievable by permutations and combinations of the resistor devices—and their segments—on the chip. This list can be generated by conventional means from a description of the number and location of the resistor devices and their contact locations on the chip.

Block 511 begins a loop through each logical or schematic resistance in the logical circuit description, by selecting each one in turn. Block 521 determines whether the selected logical resistance can be implemented within a single physical resistor device. If not, block 522 compares the logical resistance to the resistance of one device, to determine how many full devices must be connected in series, if the desired logical resistance is too high. Block 523 then calculates the remainder of the logical resistance to be implemented after the requisite number of full devices have been connected together to bring the physical resistance as close as possible below the desired value, using only the possible values developed in block 503.

Block 512 is entered directly from block 521 if the desired total resistance can be implemented on a single physical resistor, or from block 523 to implement the remainder of the desired resistance after multiple full devices have brought that remainder within range of a single device. Block 512 determines, from the list built in block 503, which possible interconnection of the segments of a single physical resistor device would most closely approximate the specified logical resistance value (from block 511), or the remainder of the logical value (from block 523). If the total logical resistance or the remainder is below the minimum value obtainable in a single physical device, the resistance value is merely dropped. If the logical value is within a fixed tolerance of the maximum resistance of a single physical resistor, a full resistor device is wired, or another full resistor device is placed in series with any devices specified by blocks 522–523.

Block 514 constructs a "net list" (a description of a wiring pattern) for connecting the physical resistors specified by block 513 for implementing a single logical resistance, and outputs the locations of the terminal points of the entire configuration as connections to other elements in the overall circuit. Then, if any logical resistances remain to be processed in the logical circuit description, block 515 returns control to block 511. Otherwise, block 504 ends the procedure.

Figure 6A:
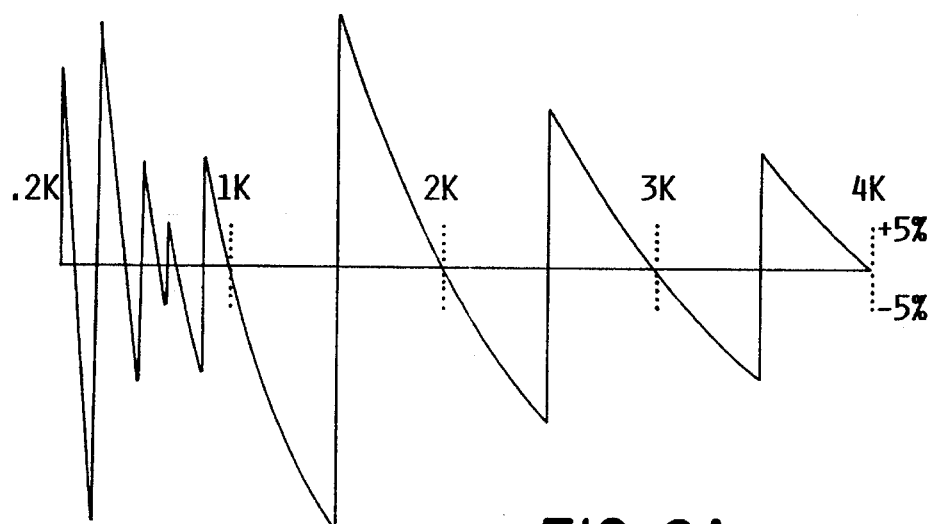
FIGS. 6A, 6B, and 6C are charts illustrating resistor tolerances for various configurations of the resistor devices of FIG. 3.
Figure 6B:
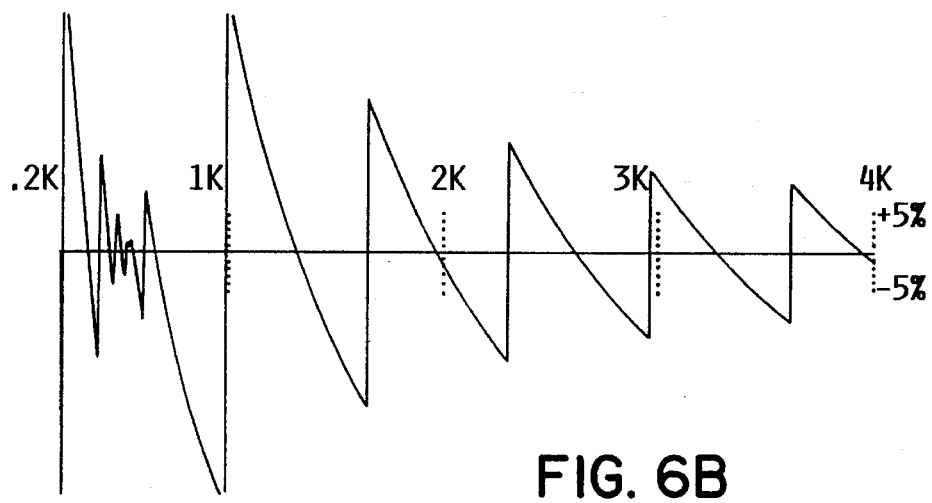
Figure 6C:
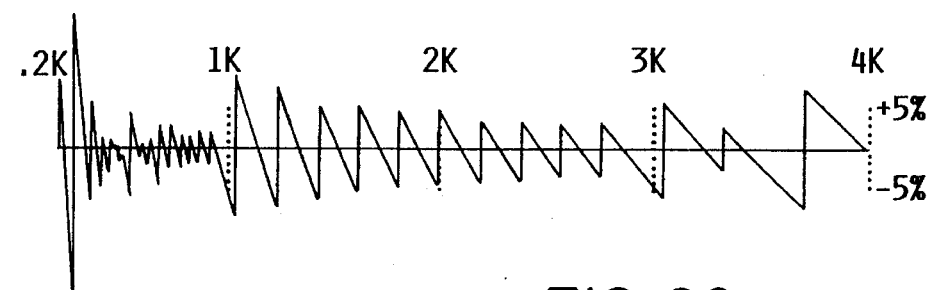

FIG. 6 shows how the segment sizes of the fixed-contact resistor devices may be determined to achieve small overall tolerance errors. FIG. 6A is a plot of the percentage error (vertical axis) between physically implementable resistances and desired logical resistance values for values of logical or desired resistance (horizontal axis). The device illustrated in FIG. 6A comprises four segments of 1 Kohm each; thus the graph runs from 250 ohms to 4 Kohms. This provides the smallest number of unique resistance values and a large initial tolerance errors, since many combinations of two or more segments in series or parallel yield identical effective values. Using more segments of smaller individual resistance (to keep the maximum single-device value constant) does not improve the situation significantly. FIG. 6B is a plot of errors for a resistor device having six segments of 660 ohms each. Besides not reducing the tolerance errors by any significant amount, a larger number of segments decreases the maximum resistance obtainable, and makes wiring more complex. FIG. 6C is a plot of errors for a device having four segments having nominal values of 576 ohms, 758 ohms, 1131 ohms, and 1516 ohms, totaling 4 Kohms less a small amount for contacts. The peak errors are very much reduced from those of FIGS. 6A and 6B, and the average errors are also considerably reduced. These values were chosen so as to make the values of all possible sums of segment values different from each other and from the values of the segments themselves. This is not difficult, and was done substantially by hand in the present embodiment.

Figure 7:
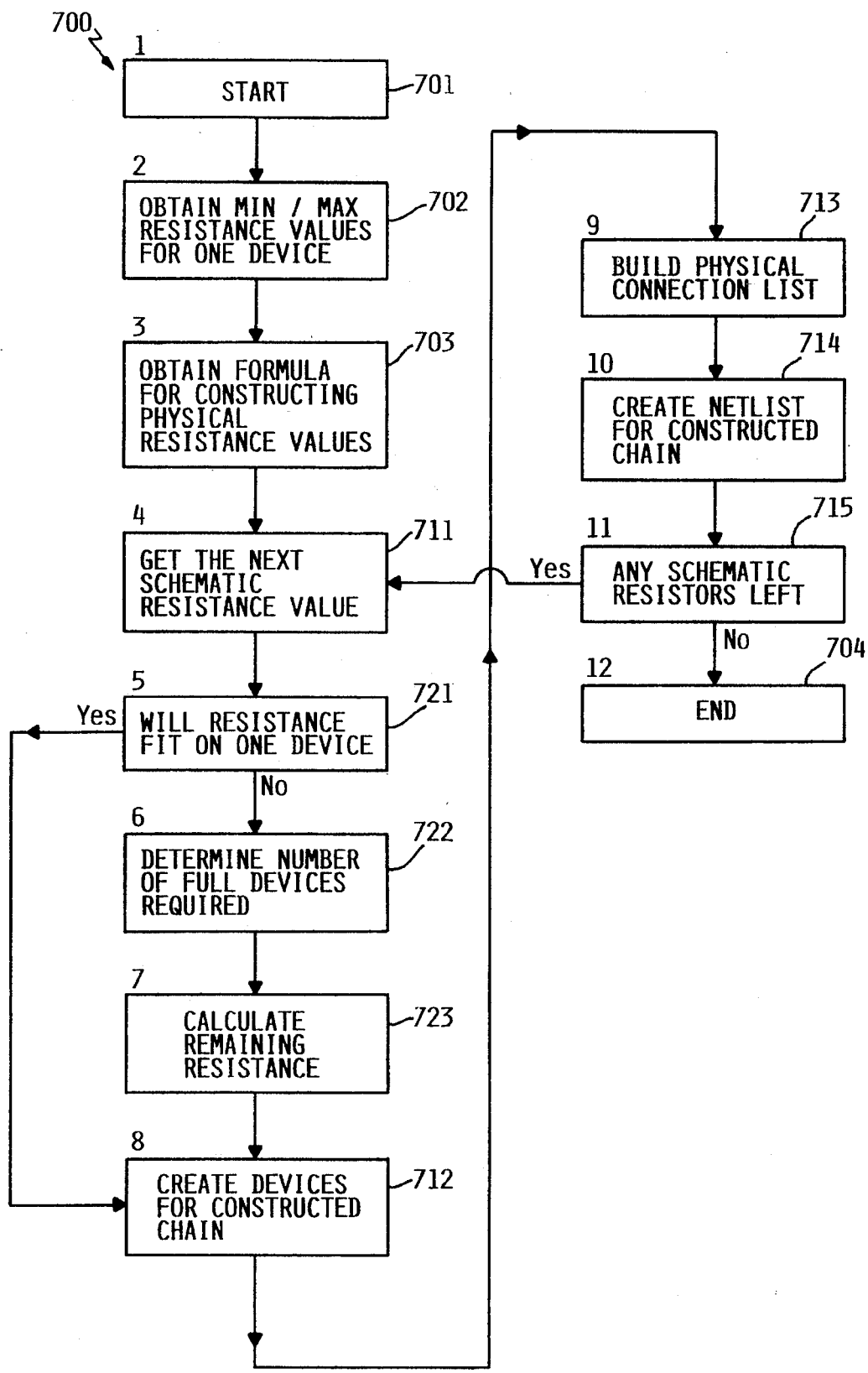
FIG. 7 is a flowchart of a method for configuring the resistor devices of FIG. 4.

FIG. 7 shows a method of wiring variable-contact resistor devices such as 210D, 210E, and 21OF, FIG. 4, to achieve resistance values as specified by the logical description of the overall circuit to be implemented on the chip. Flowchart 700 starts at block 701. Block 702 obtains data concerning the maximum and minimum resistance values for a single physical resistor device in the particular semiconductor technology being used for the circuit implementation. Block 703 constructs a function of the length between contacts, given a desired logical resistance value. This relationship is not quite linear, because of the effects of the contacts; it is, however, easily derivable or measurable for a given technology. Block 711 obtains one logical resistance from the circuit description for implementation, just as block 511 does in FIG. 5.

Blocks 721–723 conceptually perform the same functions as blocks 521–523, FIG. 5. Multiple devices are connected if the desired resistance is too large to fit on a single physical resistor device. Block 712 searches a list of segments already created. If the segment is already present, block 712 uses it. Otherwise, block 712 creates a new segment. Blocks 713–715 then perform the same functions as blocks 513–515 until no further logical resistors remain to be implemented and wired. Block 704 then ends the procedure.

APPENDIX A hereto contains source code (written in FORTRAN 66) for two programs for converting the logical resistances of a circuit description to a wire list or net list which can be used by conventional placement and wiring programs to produce wiring on a semiconductor chip containing physical resistor devices such as 210, FIG. 2, in circuit bricks 122, FIG. 1. That is, the programs of Appendix A implements the methods shown in FIGS. 5 and 7.

Figure 8:
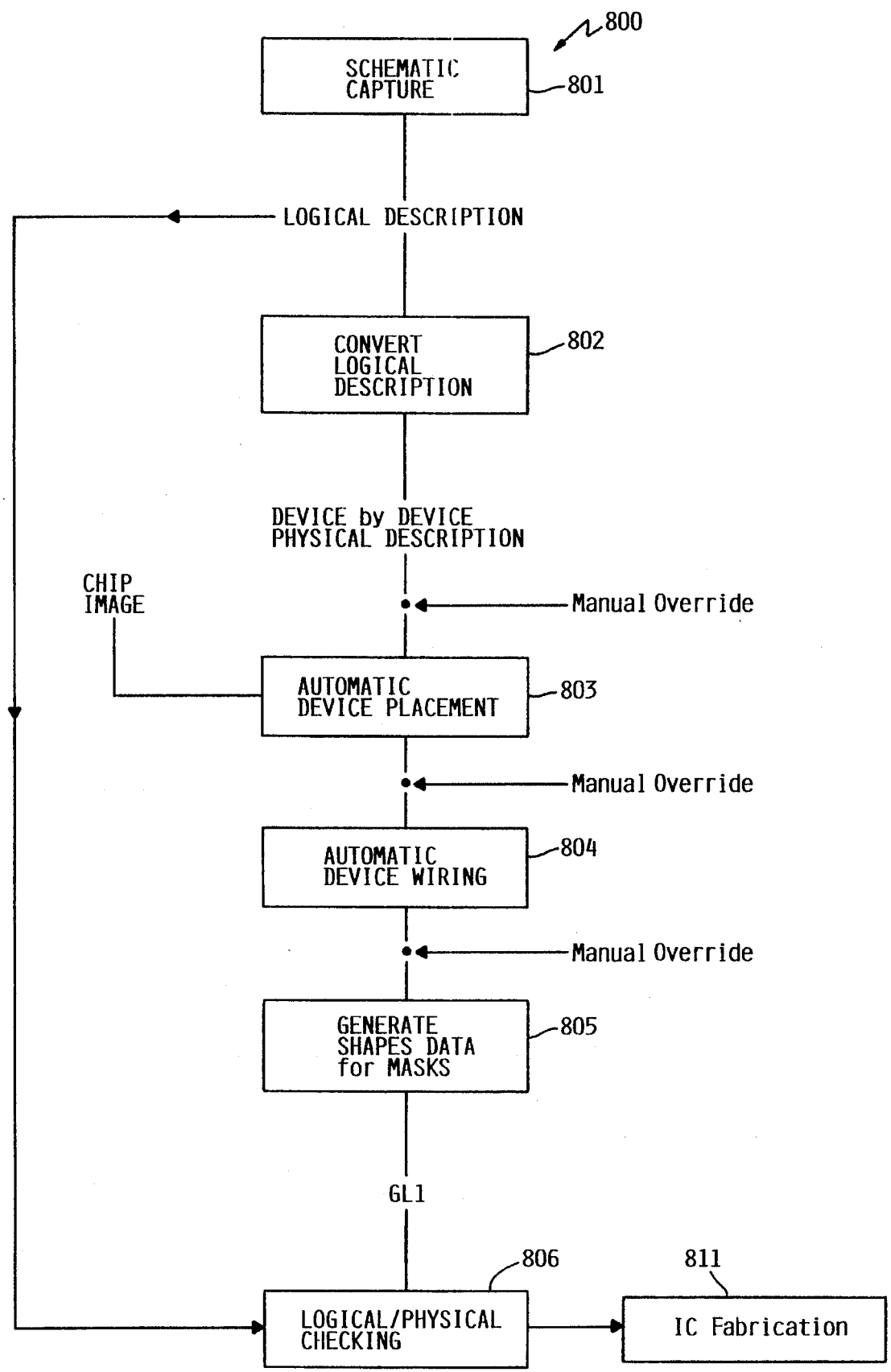
FIG. 8 is a flowchart of a method for laying out circuits on a chip according to the invention.

FIG. 8 is a flowchart of the overall method for laying out a circuit on a semiconductor chip according to the invention. Block 801 first captures the "logical description" of the overall circuit. This description embodies the topology and component specifications of the circuit as a whole; it may be a schematic diagram or an equivalent set of information in any conventional form readable by a data processor. One such form is the ASTAP format, generated by the publicly available ASTAP ("Advanced Statistical Analysis Program") program.

Block 802 converts the logical description to a "physical description" containing net-list data representing elemental devices in a selected semiconductor technology and the topology of their interconnections with each other. The publicly known general-purpose BDLS ("Basic Design Language for Structure") data format may be used to specify the physical description. A representation of the physical description may be output for manual inspection and/or modification at this point, if desired.

The physical description also includes specifications of connections between the devices and the structure 130 of power busses shown in FIG. 1. Since conventional APW (automatic placement and wiring) programs do not include the concept of a linear structure such as a wire or bus, each bus is preferably represented as a relatively large number of points at spaced locations which may be wired to a device whenever a connection from that bus to the device is called for. Each such point is specified as a "device" in the same manner as a transistor or resistor contact. The chip bias-voltage connections are likewise represented as a number of "device" points at certain locations such as 135, FIG. 1, with inherently specified connections to bus 133. This allows the busses and the bias points to be treated the same as any other wire as far as the subsequent APW programs are concerned; a bus, for example, is built up when the APW programs wire interconnection conductors among the "devices" representing points on that bus. In conventional techniques, busses and power connections are typically specified as fixed areas which are inaccessible to personalized signal wiring; this limits the efficiency with which the APW programs can minimize the signal-wiring lengths.

Next, block 803 "places" the individual devices in the physical description at specific locations on the chip 100, FIG. 1. This term of art denotes the association of each element of the physical description with a particular transistor, diode-wired transistor or resistor device in the bricks 122. The locations of these devices on the chip are specified to block 803 as a "chip description" or "chip image" data. Publicly available placement programs for digital integrated circuits are suitable for this analog chip as well, because of the brick structure of the individual devices. Representative placement programs are described in Kirkpatrick, et al., "Optimization by Simulated Annealing," Science, Vol. 220, No. 4598, pp. 671–680 (May 13, 1983), and in Gelatt, Jr., et al., "Optimization of an Organization of Many Discrete Elements," U.S. Pat. No. 4,495,559 (Jan. 22, 1985). Manual inspection and/or intervention may also be provided after block 803.

Block 804 "wires" the devices on the chip according to the net list in the physical description. This term denotes the generation of actual paths for each interconnection specified in the net list, given the actual locations of the devices produced (i.e., placed) by block 803. Known automatic wiring programs use a variety of approaches to reduce the overall lengths of these paths. A suitable program is described in Elmendorf, "KWIRE: A Multiple-Technology, User-Reconfigurable Wiring Tool for VLSI," IBM Journal of Research and Development, Vol. 28, No. 5, pp. 603–612 (September 1984). Here too, manual inspection and intervention may override the program-generated data.

Block 805 uses the placement and wiring data to produce a "mask description" of the chip, specifying the shapes of actual masks (or other means) for fabricating the various semiconductor and metal layers of the chip. This description may be in the publicly available "GLi" (Graphic Language One) data format.

Block 806 checks the final shape data against the original logical description. This is done to ensure that no errors have occurred, and also to determine that no groundrules of the technology have been broken. For example, block 806 may check to ensure that no wires are spaced closer together than the minimum distance allowed by the semiconductor technology being used.

Finally, block 811 uses the mask description (or its equivalent) to fabricate actual masks, and then the chip 100 from the masks. (Some technologies might not use masks for all fabrication steps, but rather an electron beam controlled by a form of the GL1 data to fabricate certain structures on the chip.)

It should be noted that the above method treats I/O-contact wiring just like any other wiring, so that block 804 may wire directly to a contact 111, FIG. 1, rather than being restricted to wire only to an I/O driver circuit cell, for example. Chip biasing connections such as 135, FIG. 1, are also made merely by specifying the connection points and allowing block 804 to wire them exactly like any other circuit connection. This provides greater flexibility, because the wiring program need not wire around fixed, pre-existing connections. The power-bus structure, 130, however, is predefined by specifying particular fixed connection locations to block 803. This is preferable to specifying the busses merely as certain blocked or unusable areas to the APW programs, as is commonly done in digital-logic wiring programs. The present method allows the APW programs of blocks 803 and 804 to connect the power busses to those devices in the circuit requiring direct power connections in exactly the same way as all other wiring is done.

Figure 9:
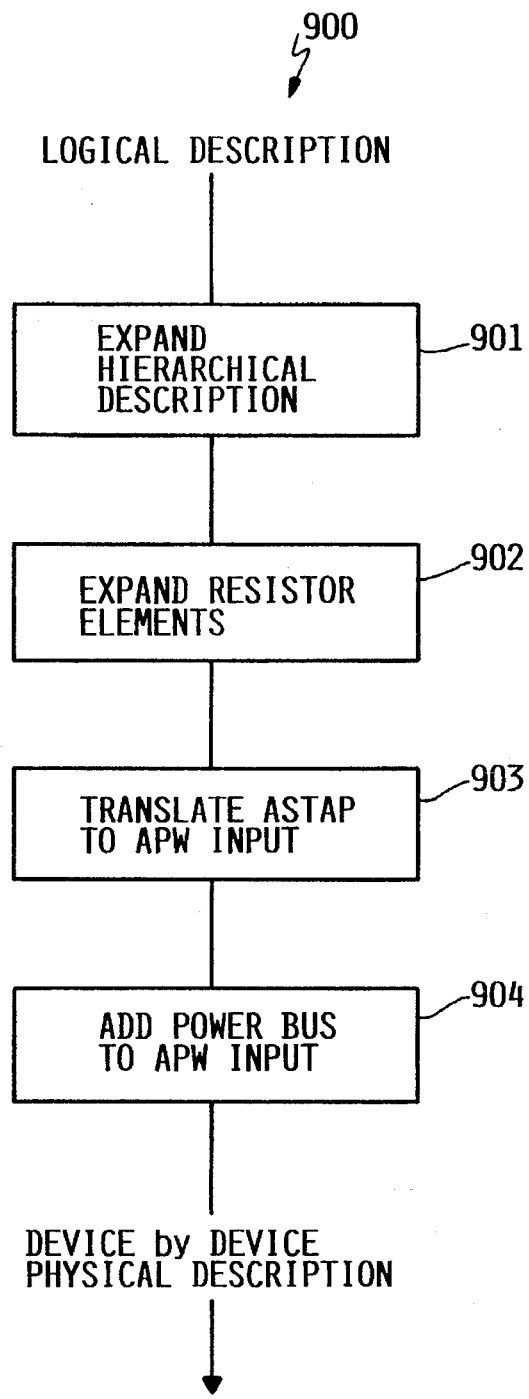
FIG. 9 is a flowchart detailing the conversion of a logical to a physical circuit description in FIG. 8.

FIG. 9 details the conversion of the logical circuit description to the physical description in block 802, FIG. 8. This conversion preferably occurs in several stages, to increasing levels of detail. For example, block 901 could first expand a multiple-device current-source element at the logical level to a subcircuit comprising particular kinds of transistors and resistors in a particular configuration. Then, block 902 expands the resistor values specified in this intermediate-level description by interconnecting particular physical resistor devices to achieve certain resistance values specified in the intermediate description. This process has been described in detail hereinabove. Block 903 is merely a data-translation step to satisfy the requirements of the particular APW program used.

Block 904 adds data representing the predefined power bus structure to the physical-description data produced by block 903. This data includes the locations of bus connection points, chip-bias points, etc., as described in connection with FIGS. 1 and 8.

Having described a preferred embodiment thereof, we claim as our invention:

APPENDIX A

```
C*****************************************************************
C TITLE/DESCRIPTION: ASTAP TO BDLS CONVERTER
C*****************************************************************
      IMPLICIT INTEGER*2($), LOGICAL*1(Z), REAL*8(Q)
      DIMENSION ZBDLS(216,200), $CNT(200), ZMODL(6)
      DIMENSION ZNA(10), ZNB(10)
      DIMENSION ZE(8), ZN(10),ZP(4),ZN2(10),ZNODE(14), ZWORK(14)
      DIMENSION ZCARD(72)
      COMMON IPR, IPAGE, NELEM, ZLASCM(60),ZOUT(210),ZSHEET(216)
      COMMON $, ITHR1, ITHR2, ZCOMNT(60), NNODES,ZNODES(22,5000)
      DATA ZE/'P','G','0','0','0','X','X','/'/
      DATA ZN/'P','G','0','0','1','#',' ',' ',' ','/'/
      DATA QB/' '/, ZP/' ',' ',' ','/'/
      DATA ZN2/' ',' ',' ',' ',' ',' ',' ',' ',' ',' ','/'/
      DATA ZLEFT/'('/, ZRIGHT/')'/, ZSTAR/'*'/
      DATA ZNA/'#','A','S','T','A','P',3*0,'/'/, ZNB/9*' ','/'/
      DATA ZCOMA/','/, ZEQ/'='/, ZQUOT/''''/, ZB/' '/
      DATA ZMNUS/'-'/
C
C ZNODES(1-14,): ASTAP NET NAME.
C       (15-21,): BDLS NET NAME (W/O "PG")
C       (22,): NUMBER OF CONNECTIONS TO THIS NET
      IPR=5
C
      DO 30 I=1,60
      ZCOMNT(I)=ZB
30    ZLASCM(I)=ZB
      IPAGE=0
      NMOD=0
      NNODES=0
      $BINDX=0
      ITHR1=30
      ITHR2=90
      ZSHEET(1)=0
C GET THE NEXT BDLS TRANSLATION (PROTOTYPE) STATEMENT
40    READ(1,50,END=70) (ZBDLS(I,NMOD+1),I=1,216)
50    FORMAT(72A1)
      NMOD=NMOD+1
      $CNT(I)=0
C SAVE LOCATIONS OF BUNDLE AND SHEET PROTOTYPE STATEMENTS
      IF(ICLCC(ZBDLS(1,NMOD),6,'BU    ').EQ.0
     *                    .AND. $BINDX.EQ.0) $BINDX=NMOD
      IF(ICLCC(ZBDLS(1,NMOD),6,'SHEET ').EQ.0)
     *                   CALL IMOVEC(ZSHEET,216,ZBDLS(1,NMOD))
C ALLOW UP TO 200 PROTOTYPE STATEMENTS
      IF(NMOD.LT.200) GOTO 40
      WRITE(IPR,60)
60    FORMAT(' ERROR -- NUMBER OF BDLS PROTOTYPE STATEMENTS ',
     *  'MUST NOT EXCEED 200')
      STOP 8
C ALL TRANSLATION STATEMENTS ARE READ; GET THE USCASTAP
70    NELEM=0
      IF($BINDX.EQ.0) WRITE(IPR,80)
80    FORMAT(' WARNING - A "BU" PROTOTYPE STMT WAS NOT FOUND.')
      IF(ZSHEET(1).EQ.0) WRITE(IPR,90)
90    FORMAT(' WARNING - A "SHEET" PROTOTYPE STMT WASN''T FOUND')
C GET ONE USCASTAP STATEMENT
100   READ(8,50,END=410) ZCARD
      IF(ZCARD(1).NE.ZMNUS) GOTO 110
C PROCESS A CHAINED RESISTOR.
      CALL ABRES(ZBDLS,NMOD,ZCARD,ZE,ZP,NBUSED,0,KRULE)
C ADD # OF OUTPUTTED BDLS STATEMENTS TO THE USAGE OF THIS RES
      $CNT(KRULE)=$CNT(KRULE)+NBUSED
      GOTO 100
```

Figure 13. Fixed-value mainline (1 of 6).

```
C
110   IPTR=1
      CALL GETN(ZNODE,ZCARD,IPTR)
      IF(ZNODE(1).EQ.ZB) GOTO 100
C IF "*" CARD SAVE COMMENTS. THEY WILL BECOME PART OF "TI" FIELD
      IF(ZNODE(1).NE.ZSTAR) GOTO 150
C IF A "**" CARD, THROW IT AWAY
      IF(ZNODE(2).EQ.ZSTAR) GOTO 100
      CALL IMOVEC(ZCOMNT,60,ZCARD(3))
C FIND THE PERIOD, IF ANY, IN THIS COMMENT CARD.
C INFORMATION AFTER THE FIRST PERIOD IS THE TITLE OF THE SHEET
      CALL EDITSO(ZCOMNT,60,'./','./',I,J)
      IF(I.LE.0) GOTO 100
C THE PERIOD MUST BE BEFORE THE COMMA
C FIND THE COMMA, IF ANY, IN THIS COMMENT CARD.
      CALL EDITSO(ZCOMNT,60,',/',',/',K,L)
C NO COMMA?, FIND THE TRAILING SPACE
      IF(K.EQ.0) CALL EDITSO(ZCOMNT,60,' /',' /',K,L)
C PERIOD IS PRESENT. IS NESTED NAME LIST(SHEET TITLE) DIFFERENT?
120   N=L-J-1
      IF(N.LE.0) GOTO 100
C IF YOU WANT THE NET NAMES TO BE CHECKED AGAINST THE APW LIMIT
C OF 124 AFTER EACH ELEMENT THEN GOTO 136 ON THE NEXT STATEMENT
C IF YOU WANT THE NET NAMES TO BE CHECKED AGAINST THE APW LIMIT
C OF 124 AFTER EACH MACRO THEN GOTO 90 ON THE NEXT STATEMENT
      IF(ICLCC(ZLASCM(1),N,ZCOMNT(J+1)).EQ.0) GOTO 130
C NAME LIST CHANGED. START A NEW PAGE
          NELEM=676
C SAVE THE NESTED NAME LIST (SHEET TITLE)
          CALL IMOVEC(ZLASCM,1,ZB)
          CALL IMOVEC(ZLASCM(2),59,ZLASCM)
          CALL IMOVEC(ZLASCM,N,ZCOMNT(J+1))
          CALL NXTBLK(ZE,ZP)
C LOOK FOR ANY NODES USED MORE THAN THE MAXIMUM APW LIMIT (124)
C IF ANY ARE OVER, ZERO THE 9TH CHARACTER OF THE ASTAP NET NAME,
C SO THAT NO MORE CONNECTIONS WILL BE MADE TO IT. THESE NETS
C WILL BE FLAGGED AT THE END OF THE PROGRAM AND WILL HAVE TO BE
C MANUALLY FIXED UP AFTER IGW IS USED TO DO ALL OVERFLOWS.
130       DO 140 I=1,NNODES
          IF(ZNODES(22,I).LT.ITHR2) GOTO 140
              ZNODES(14,I)=0
140       CONTINUE
C ALL DONE WITH THE "*" CARD. GET THE NEXT USCASTAP STATEMENT
      GOTO 100
C IF THIS USCASTAP IS AN "END" CARD, TERMINATE
150   IF(ICLCC(ZNODE,6,'END   ').EQ.0) GOTO 410
C FIND THE BDLS TRANSLATION STMT FOR THIS USCASTAP MODEL
      DO 160 II=1,NMOD
      IF(ICLCC(ZNODE,6,ZBDLS(1,II)).EQ.0) GOTO 210
160   CONTINUE
C THIS USCMODEL WAS NOT FOUND IN THE FT01F001 PROTOTYPE DATA SET
C SHOULD A BUNDLE STATEMENT BE PROVIDED?
      IF($BINDX.EQ.0) GOTO 190
      IF(ZCARD(IPTR).NE.ZLEFT) GOTO 190
C DETERMINE IF ONLY ONE NET IS PRESENT; IF MORE, ERROR
      JPTR=IPTR+1
      CALL GETN(ZWORK,ZCARD,JPTR)
      IF(ZCARD(JPTR).NE.ZRIGHT) GOTO 190
C ONE NET IS DEFINED; CREATE A BUNDLE STATEMENT
      CALL IMOVEC(ZOUT,210,ZBDLS(7,$BINDX))
C INSERT THE ASTAP MODEL NAME IN THE BUNDLE STATEMENT
      CALL IMOVEC(ZNODE(7),1,'/')
      CALL EDITSO(ZOUT,210,'#MODEL/',ZNODE,I,J)
C INSERT THE ASTAP NET NAME IN THE BUNDLE STATEMENT
```

Figure 14.   Fixed-value mainline (2 of 6).

```
              Z=ZWORK(10)
              CALL IMOVEC(ZWORK(10),1,'/')
              CALL EDITSO(ZOUT,210,'#ASTAP001/',ZWORK,I,J)
              ZWORK(10)=Z
C INSERT THE BDLS NET NAME IN THE BUNDLE STATEMENT
CC      WRITE(IPR,148) (ZNODES(I,JJ),I=1,21),ZOUT
CC8     FORMAT('FORMAT148: ',21A1,/,(72A1))
              DO 170 JJ=1,NNODES
              IF(ICLCC(ZWORK,14,ZNODES(1,JJ)).EQ.0) GOTO 180
170           CONTINUE
C ASTAP/BDLS NETNAME CORRESP. DOES NOT EXIST; COPY ASTAP NET
              NNODES=NNODES+1
              JJ=NNODES
              CALL IMOVEC(ZNODES(1,JJ),14,ZWORK)
CC            CALL IMOVEC(ZNODES(14,JJ),1,' ')
              CALL IMOVEC(ZNODES(15,JJ),7,ZWORK)
              ZNODES(22,JJ)=0
180           CALL IMOVEC(ZWORK(3),7,ZNODES(15,JJ))
              CALL IMOVEC(ZWORK(1),2,'PG')
              CALL EDITSO(ZOUT,210,'PG001#001/',ZWORK,I,J)
              ZNODES(22,JJ)=ZNODES(22,JJ)+1
C OUTPUT THE BUNDLE STATEMENT
              GOTO 390
C UNDEFINED MODEL HAS 2 OR MORE NODES. CAN'T BE A BUNDLE STMT.
190     WRITE(IPR,200) ZNODE, IPTR, ZCARD
200     FORMAT(' ERROR -- UNDEFINED MODEL: ',14A1,
       * ' (NO PROTOTYPE STATEMENT) NEAR COLUMN',
       * I3,' ON THIS CARD:',/,1X,72A1)
              GOTO 100
C BUILD PG001## AND PP=##X VALUES + INSERT THEM INTO BDLS STMT
210     CALL NXTBLK(ZE,ZP)
C ADD 1 TO THE USAGE OF THIS TYPE
              $CNT(II)=$CNT(II)+1
C SAVE THE PROPER PROTOTYPE STATEMENT
              CALL IMOVEC(ZOUT,210,ZBDLS(7,II))
C INSERT THE PROPER (NEXT AVAILABLE) BLOCK NAME
              CALL EDITSO(ZOUT,210,'PG001#E/',ZE,I,J)
              IF(I.NE.0) GOTO 230
              WRITE(IPR,220) (ZOUT(I),I=1,216)
220     FORMAT(' ERROR - "PG001#E" NOT FOUND ON THIS STATEMENT:',
       * /,(1X,72A1))
              GOTO 100
C INSERT THE PROPER (NEXT AVAILABLE) PRINT POSITION
230     CALL EDITSO(ZOUT,210,'#PP/',ZP,I,J)
              IF(I.NE.0) GOTO 250
              WRITE(IPR,240)
240     FORMAT(' ERROR -- #PP WAS NOT FOUND')
              GOTO 100
C DO ALL OF THE NODES ON THIS USCASTAP STATEMENT
250           DO 370 III=1,20
C #001 #002 #003... BUILD THE "FIND" STRING... (PG001#00X)
              CALL ICVD(III,3,ZN(7))
              CALL IMOVEC(ZNA(7),3,ZN(7))
              ZLCH=ZCARD(IPTR)
              IPTR=IPTR+1
              IF(IPTR.LT.72) GOTO 260
                 IF(ZLCH.EQ.ZCOMA) GOTO 270
C GET THE NEXT NET NAME
260           CALL GETN(ZNODE,ZCARD,IPTR)
              IF(ICLCC(ZNODE,8,QB).NE.0) GOTO 280
C LAST NET NAME CAME OUT BLANK. (LAST NET ON CARD ALREADY READ)
C IF LAST NON-BLANK CHAR WAS ',' THEN READ ANOTHER
C     (CONTINUATION CARD)
              IF(ZLCH.NE.ZCOMA) GOTO 370
```

Figure 15. Fixed-value mainline (3 of 6).

```
C IT WAS A COMMA.
270       READ(8,50) ZCARD
          IPTR=1
          GOTO 260
C FIND THIS USCASTAP NETNAME IN THE ASTAP/BDLS NETNAME
C     EQUIVALENCE LIST
280       DO 290 JJ=1,NNODES
            IF(ICLCC(ZNODE,14,ZNODES(1,JJ)).EQ.0) GOTO 340
290       CONTINUE
C NET NAME WAS FOUND; USE THE PG001## + PIN ID TO GET ##10,##A1,
          NNODES=NNODES+1
          IF(NNODES.LT.5000) GOTO 310
          WRITE(IPR,300)
300       FORMAT(' ERROR -- # OF UNIQUE NETNAMES EXCEEDS 5000')
          STOP
C CREATE A NEW ENTRY IN THE ASTAP/BDLS NETNAME EQUIV LIST.
C THIS IS THE FIRST OCCURRENCE OF THE ASTAP NET NAME
310       JJ=NNODES
C SAVE ORIGINAL USCASTAP NETNAME & BDLS BLOCK NAME: PG001##
          CALL IMOVEC(ZNODES(1,JJ),14,ZNODE)
          CALL IMOVEC(ZNODES(15,JJ),5,ZE(3))
C SET THE NETNAME CONNECTION COUNT TO ZERO
          ZNODES(22,JJ)=0
C FIND THE CHARACTER COLUMN WHERE THIS NET NAME EXISTS IN BDLS
          CALL EDITSO(ZOUT,210,ZN,ZN,K,L)
          IF(K.GT.0) GOTO 330
C #001 WAS NOT FOUND; LOOK FOR #ASTAP INSTEAD
          CALL EDITSO(ZOUT,210,ZNA,ZNA,K,L)
          IF(K.GT.0) GOTO 330
          WRITE(IPR,320) (ZNA(I),I=1,9), ZOUT
320       FORMAT(' ERROR -- ',9A1,' WAS NOT FOUND ON THIS CARD.',
     *    /,(120A1))
C SAVE THE I/O PIN OF THIS BLOCK  10, A1, A2,...
330       CALL IMOVEC(ZNODES(20,JJ),2,ZOUT(L-3))
C COPY THE PAGE-BLOCK-PIN STRING INTO THE "REPLACE" WORK BUFFER
340       CALL IMOVEC(ZN2(3),7,ZNODES(15,JJ))
          CALL IMOVEC(ZN2(1),2,'PG')
C CHANGE THE #001, #002, #003 ... NODES
          CALL EDITSO(ZOUT,210,ZN,ZN2,I,J)
          ZNODES(22,JJ)=ZNODES(22,JJ)+1
          K=I
C CHANGE THE #ASTAP001, #ASTAP002, #ASTAP003 ... NODES
          CALL IMOVEC(ZNB,9,ZNODE)
          CALL EDITSO(ZOUT,210,ZNA,ZNB,I,J)
          ZNODES(22,JJ)=ZNODES(22,JJ)+1
          K=K+I
C ERROR IF THE PIN WAS NOT DEFINED ON THE BDLS SAMPLE STATEMENTS
          IF(K.NE.0) GOTO 370
350       WRITE(IPR,360) (ZN2(I),I=1,9), (ZN(I),I=1,9),ZCARD,ZOUT
360       FORMAT(' ERROR -- NETNAME SUBSTITUTION ERROR ("',9A1,
     *    '" FOR "',9A1,'") ON THESE STATEMENTS:',/,10X,
     *    'ASTAP:  ',72A1,/,(10X,'BDLS:   ',72A1))
          GOTO 100
C DO EVERY ASTAP NODE
370       CONTINUE
C INSERT THE TITLE FIELD INTO STATEMENT (FROM PREVIOUS "*" CARD)
          CALL EDITSO(ZOUT,210,'#TI/','#TI/',I,J)
          IF(I.LE.0) GOTO 390
C REPLACE UP TO BLANK CHARACTERS UNTIL QUOTE FOUND IN #TI FIELD
          DO 380 I=1,60
          CALL IMOVEC(ZOUT(J),1,ZCOMNT(I))
          J=J+1
          IF(ZOUT(J).EQ.ZQUOT) GOTO 390
380       CONTINUE
```

Figure 16.   Fixed-value mainline (4 of 6).

```
C ENSURE EVERY "#" WAS REPLACED ON THIS CARD. PROG ERROR IF NOT
390     CALL EDITSO(ZOUT,210,'#/','#/',I,J)
        IF(I.NE.0) GOTO 350
C THE BDLS CARD IS COMPLETE AND GOOD; SAVE IT
        WRITE(9,400) ZOUT
400     FORMAT(72A1)
C ERASE THE #TI FIELD FOR THE NEXT ELEMENT
        ZCOMNT(1)=ZB
        CALL IMOVEC(ZCOMNT(2),59,ZCOMNT)
        GOTO 100
C ALL USCASTAP STATEMENTS CONVERTED. LIST USAGE + WARNING INFO
410     WRITE(IPR,420)
420     FORMAT(//,' ASTAP/BOOK-NAME   TIMES-USED')
        NTOT=0
C LIST # OF TIMES EACH PROTOTYPE NAME (BTR) WAS REFERENCED
        DO 500 I=1,NMOD
        IF($CNT(I).LE.0) GOTO 500
        CALL IMOVEC(ZBDLS(7,I),8,QB)
C FIND THE "==" IN THE PROTOTYPE STATEMENT
        DO 430 J=9,206
        IF(ZBDLS(J,I).EQ.ZEQ .AND. ZBDLS(J+1,I).EQ.ZEQ)
     *                  GOTO 440
430     CONTINUE
440     J=J+2
C SKIP PAST THE COMMA THAT IS AFTER ==
        DO 450 K=1,8
        J=J+1
        IF(ZBDLS(J-1,I).EQ.ZCOMA) GOTO 460
450     CONTINUE
C SAVE UP TO 8 CHARACTERS OR UNTIL COMMA IS FOUND
460     DO 470 K=7,14
        CALL IMOVEC(ZBDLS(K,I),1,ZBDLS(J,I))
        J=J+1
        IF(ZBDLS(J,I).EQ.ZCOMA) GOTO 480
470     CONTINUE
C LIST THE ASTAP/BTR/USAGE INFORMATION FOR THIS PROTOTYPE STMT
480     WRITE(IPR,490) (ZBDLS(J,I),J=1,14), $CNT(I)
490     FORMAT(1X,6A1,1X,8A1,I8)
        NTOT=NTOT+$CNT(I)
500     CONTINUE
C LIST THE TOTAL NUMBER OF MODELS/BTRS USED
        WRITE(IPR,510) NTOT
510     FORMAT(20X,'----',/,16X,I8,//)
C SUM VALUES FOR EACH BOOK NAME. USEFUL FOR WHEN 2 OR MORE ASTAP
C   MODELS USE THE SAME BTR NAME IN THEIR PROTOTYPE STATEMENTS
        DO 530 I=1,NMOD
        IF($CNT(I).LE.0) GOTO 530
        J=I-1
        IF(J.LE.0) GOTO 530
        DO 520 K=1,J
        IF(ICLCC(ZBDLS(7,K),8,ZBDLS(7,I)).NE.0) GOTO 520
C SAME NAME
        $CNT(K)=$CNT(K)+$CNT(I)
        $CNT(I)=0
520     CONTINUE
530     CONTINUE
C LIST OUT THE INFORMATION JUST COLLECTED ABOVE.
        DO 550 I=1,NMOD
        IF($CNT(I).LE.0) GOTO 550
        WRITE(IPR,540) (ZBDLS(J,I),J=7,14), $CNT(I)
540     FORMAT(1X,6X,1X,8A1,I8)
550     CONTINUE
        WRITE(IPR,510) NTOT
C LIST THOSE NETS WHICH HAVE MORE THAN 30 CONNECTIONS
```

Figure 17.  Fixed-value mainline (5 of 6).

```fortran
              WRITE(IPR,560) ITHR1
560     FORMAT(' THESE NETS HAVE MORE THAN',I4,' CONNECTIONS',
       *        /,' ASTAP            BDLS       #CONNECTIONS',/)
C ONLY LIST THOSE BETWEEN 30 - 90 CONNECTIONS HERE.
C OVER 90 COMES LATER
              DO 570 J=1,NNODES
570           IF(ZNODES(22,J).GT.ITHR1 .AND. ZNODES(22,J).LT.ITHR2)
       *                    WRITE(IPR,660) (ZNODES(I,J),I=1,22)
C LIST NETS WHICH EXCEEDED THE MAX NUMBER OF CONNECTIONS FOR APW
        K=0
        ICONN=0
              DO 610 I=1,NNODES
              JJ=ZNODES(22,I)
              IF(JJ.GE.2) ICONN=ICONN+JJ-1
              IF(ZNODES(14,I).NE.0) GOTO 590
C THIS NODE MUST BE LISTED
580           K=K+1
              CALL IMOVEC(ZNODES(1,K),22,ZNODES(1,I))
              GOTO 610
C SHOULD THIS NODE BE LISTED? IS ASTAP = ANY OTHER LISTED NODE?
590           IF(K.EQ.0) GOTO 610
                DO 600 J=1,K
600             IF(ICLCC(ZNODES(1,J),13,ZNODES(1,I)).EQ.0) GOTO 580
610           CONTINUE
        IF(K.EQ.0) GOTO 670
        WRITE(IPR,620)
620     FORMAT(/,' WARNING -- THESE NETS EXCEED (OR ARE CLOSE TO)'
       * ,' THE MAXIMUM NUMBER OF CONNECTIONS FOR APW',/,
       * ' ASTAP            BDLS       #CONNECTIONS',/)
C SORT THE LARGE NETS BY NAME AND LIST THEM
C WITH TOTALS FOR EACH GROUP OF PIECES
              DO 650 I=1,K
              M=ZNODES(22,I)
              IF(M.EQ.0) GOTO 650
              WRITE(IPR,660) (ZNODES(J,I),J=1,22)
              IF(I.GE.K) GOTO 650
              L=I+1
C FIND ALL OTHER PIECES WITH THIS SAME NAME AND LIST THEM NOW
              DO 630 J=L,K
                IF(ICLCC(ZNODES(1,I),13,ZNODES(1,J)).NE.0) GOTO 630
                  WRITE(IPR,660) (ZNODES(N,J),N=1,22)
                  M=M+ZNODES(22,J)
                  ZNODES(22,J)=0
630           CONTINUE
              WRITE(IPR,640) M
640           FORMAT(29X,'----',/,29X,I4,/)
650           CONTINUE
660     FORMAT(1X,14A1,2X,'PG',7A1,I7)
670     WRITE(IPR,680) NNODES, ICONN
680     FORMAT(/,I6,' TOTAL NETS AND ',I6,' TOTAL CONNECTIONS.')
        STOP
        END
```

Figure 18.  Fixed-value mainline (6 of 6).

```
      SUBROUTINE ABRES(ZBDLS,NMOD,ZCARD,ZE,ZP,NBUSED,IRUNSW,
     *              KRULE)
      IMPLICIT INTEGER*2($), LOGICAL*1(Z), REAL*8(Q)
      NAMELIST /RES000/ RESV, BTR, TOL, THRESH, ASTAP, BARW
      REAL*8 BTR, ASTAP
      DIMENSION $BUF1(16),$BUF2(16),$BUF3(16),RESV(16),THRESH(2)
      DIMENSION ZPBUF(120), ZBDLS(216,200),ZCARD(72),ZE(8),ZP(4)
C FOLLOWING DIMENSION STATEMENTS REFLECT 10 DIFFERENT RES RULES
      DIMENSION LPATT1(100,10), LPATT2(100,10), VPATT(200,10)
      DIMENSION $WLIST(34,100,10), QBTR(10), WBAR(10), FULL(10)
      DIMENSION MPATTS(10), MRES(10), QASTAP(10), NPARRL(10)
      DIMENSION INPAR(10)
      COMMON IPR, IPAGE, NELEM, ZLASCM(60),ZOUT(210),ZSHEET(216)
      COMMON $, ITHR1, ITHR2, ZCOMNT(60), NNODES,ZNODES(22,5000)
      DATA TOL/0.01/, $CBAR/'||'/, $CSTAR/'**'/, ISW/0/
      DATA ZCP/'P'/, ZCS/'S'/, ZB/' '/, ZCSTAR/'*'/
C
C THIS SUBROUTINE DETERMINES ALL POSSIBLE RESISTANCE VALUES THAT
C CAN BE ACHIEVED WITH SERIES+PARALLEL COMBINATIONS OF MULTIPLE
C ELEMENTS ON ONE RESISTOR BAR. STRINGS ARE DETERMINED BY
C SELECTING THOSE RESISTOR ELEMENTS WHICH CORRESPOND TO THE
C BINARY BITS OF LOOP1, LOOP2. CHECK ALL POSSIBLE COMBINATIONS
C UNLESS:  1) ANY BIT IS ON IN BOTH LOOP1
C             AND LOOP2 (ELEMENT IS USED TWICE) -OR-
C 2) LOOP1 <= LOOP2 (THIS PERMUTATION WAS ALREADY CHECKED).
C AFTER DETERMINING WHAT VALUES ARE AVAILABLE, IT THEN CALLS THE
C ROUTING PROGRAM TO MAKE THE CONNECTIONS IN BDLS FOR EACH
C RESISTANCE VALUE THAT IS PASSED TO IT.
C THIS PROGRAM WAS INITIALLY USED WITH 4-SEGMENT RESISTORS BUT
C WILL ALLOW UP TO 8 SEGMENTS ON A BAR AND POSSIBLY 16.
      IF(ISW.NE.0) GOTO 900
C EXECUTE THE FOLLOWING BLOCK OF CODE ONLY ONCE. THE FIRST TIME
C CALLED IRUNSW IS USED BY PROGRAM ASTTEST3 TO BRING UP DISPLAY
C ON 3250. IN THE ASTBDLS ENVIRONMENT, IRUNSW=0
      REWIND 1
      NRULES=0
      IF(IRUNSW.EQ.0) ISW=1
710   DO 720 I=1,16
720      RESV(I)=0.0
C GET THE NEXT &RES000 RULE AND SAVE THE VALUES
      READ(1,RES000,END=880)
      NRULES=MINO(NRULES+1,10)
      QBTR(NRULES)=BTR
      QASTAP(NRULES)=ASTAP
      WBAR(NRULES)=BARW
      IF(THRESH(1).NE.0) ITHR1=THRESH(1)
      IF(THRESH(2).NE.0) ITHR2=THRESH(2)
C DETERMINE HOW MANY RESISTOR SEGMENTS ARE ON THE RESISTOR BAR.
      DO 730 I=1,16
730      IF(RESV(I).NE.0) NRES=I
C CLEAR PRINT BUFFER
      DO 740 I=1,120
740      ZPBUF(I)=ZB
      NPATTS=0
      MAXCOM=2**NRES-1
      NSHIFT=2**(16-NRES)
      NNN=0
      LIMIT1=1
C THE BITS FROM LOOP COUNTERS "LOOP2" AND "LOOP1" INDICATE THE
C RESISTOR SEGMENTS THAT WILL BE USED ON THE BAR.
C THE SEGMENTS SPECIFIED BY LOOP1 WILL BE PLACED IN SERIES.
C THE SEGMENTS SPECIFIED BY LOOP2 WILL BE PLACED IN SERIES.
C BOTH SERIES STRINGS WILL BE PARALLELED.
      DO 780 L2=1,MAXCOM
```

Figure 19. Subroutine ABRES (1 of 5).

```
              LOOP2=L2-1
C DO NOT OVERLAP PARALLEL GROUP CONNECTIONS.
C IF SEGMENT   4 IS USED,SEGMENT 1-3 CAN BE PARALLELED-ANY COMBO
C IF SEGMENT 3-4 IS USED,SEGMENT 1-2 CAN BE PARALLELED-ANY COMBO
C IF SEGMENT 2-4 IS USED,SEGMENT 1   CAN BE PARALLELED
C IF SEGMENT 1-4 IS USED,NO OTHER SEGMENTS CAN BE PARALLELED
              IF(LOOP2.EQ.LIMIT1) LIMIT1=LIMIT1*2
              IF(LIMIT1.GT.MAXCOM) GOTO 790
C IF LOOP2 IS 0, INCREMENT LOOP1 BY 1. IF 1,INCREMENT LOOP1 BY 2
C IF LOOP2 IS 2-3, INCREMENT LOOP1 BY 4
C IF LOOP2 IS 4-7, INCREMENT LOOP1 BY 8. IF 8-15, ALL DONE.
C ABOVE 5 LINES ENSURE THAT THE 2 SERIES STRINGS WILL NOT OVLP
              DO 770 LOOP1=LIMIT1,MAXCOM,LIMIT1
C ENSURE NO SEGMENT IS DOUBLY USED.(USED IN BOTH SERIES STRINGS)
              IF(IANDF(LOOP1,LOOP2).NE.0) GOTO 770
C NO SECTIONS USED TWICE. COMPUTE RESISTANCE + SAVE THIS COMBO
C GET LEFT-JUSTIFIED BIT STRINGS
              $L1=LOOP1*NSHIFT
              $L2=LOOP2*NSHIFT
              CALL EXPND($L1,$BUF1,1)
              CALL EXPND($L2,$BUF2,1)
C V1=STRING 1 VALUE, V2=STRING 2 VALUE, V3=PARALLEL VAL OF V1+2
              V1=0
              V2=0
              V3=0
              NNN=NNN+1
              DO 750 I=1,NRES
              IF($BUF1(I).NE.0) V1=V1+RESV(I)
750           IF($BUF2(I).NE.0) V2=V2+RESV(I)
              IF(V2.EQ.0) V3=V1
              IF(V2.GT.0) V3=(V1*V2)/(V1+V2)
C ALLOW ONLY UP TO 99 VALUES. DISCARD ALL OF THE REST, IF ANY
              NPATTS=MIN0(NPATTS+1,99)
              LPATT1(NPATTS,NRULES)=LOOP1
              LPATT2(NPATTS,NRULES)=LOOP2
              VPATT(NPATTS,NRULES)=V3
C DETERMINE NET NUMBER LIST TO CONNECT THESE
C SERIES/PARALLEL SEGMENTS
              CALL WLIST($BUF1,$BUF2,$WLIST(1,NPATTS,NRULES),NRES)
              WRITE(IPR,760) NNN, LOOP1, LOOP2, ($BUF1(I),I=1,8),
     *        ($BUF2(I),I=1,8),($WLIST(I,NPATTS,NRULES),I=1,8),V1,V2,V3
760           FORMAT(3I4,2X,2(4I1,1X),2X,2(4I1,1X),2X,2(4I1,1X),
     *              3F8.1)
C SAVE THE LAST(BIGGEST)SERIES VALUE. WILL BE USED FOR FULL BARS
              IF(LOOP2.EQ.0) FULL(NRULES)=VPATT(NPATTS,NRULES)
C TO AVOID PAR. COMBINATIONS ON PARTIAL BAR, SET NPARRL < NPATTS
C TO DO    PAR. COMBINATIONS ON PARTIAL BAR, SET NPARRL = NPATTS
              NPARRL(NRULES)=NPATTS
C INPAR IS INDEX NUMBER OF THE FULL BAR (ALL SEGMENTS IN SERIES)
              IF(LOOP2.EQ.0) INPAR(NRULES)=NPARRL(NRULES)
C FILL THE PRINT ARRAY WITH STATISTICAL INFORMATION ABOUT ALL
C     POSSIBLE COMBINATIONS OF VALUES.
              NPTR=(V3+75.)/50.
              NPTR=MAX0(1,MIN0(NPTR,120))
              IF(LOOP2.EQ.0) ZZ=ZCS
              IF(LOOP2.NE.0) ZZ=ZCP
              IF(ZPBUF(NPTR).EQ.ZCS) ZPBUF(NPTR)=ZCSTAR
              IF(ZPBUF(NPTR).EQ.ZB) ZPBUF(NPTR)=ZZ
770           CONTINUE
780           CONTINUE
C DO ONE FINAL COMBO. ALL SEGMENTS IN PARALLEL ON THE BAR.
790   IF(NRES.LE.1) GOTO 880
      R=RESV(1)
              DO 800 I=2,NRES
```

Figure 20. Subroutine ABRES (2 of 5).

```
800       R=(RESV(I)*R)/(RESV(I)+R)
          NPTR=(R+75.)/50.
          NPTR=MAXO(1,MINO(NPTR,120))
          IF(ZPBUF(NPTR).NE.ZB) ZPBUF(NPTR)=ZCSTAR
          IF(ZPBUF(NPTR).EQ.ZB) ZPBUF(NPTR)=ZCP
C ADD THE PATTERN FOR ALL SEGMENTS IN PARALLEL.
          NPATTS=NPATTS+1
          LPATT1(NPATTS,NRULES)=-1
          LPATT2(NPATTS,NRULES)=-1
          VPATT(NPATTS,NRULES)=R
C DO THE WIRING LIST FOR ALL SEGMENTS IN PARALLEL (121212...)
          J=1
          DO 810 I=1,NRES
             $BUF1(I)=1
             $BUF2(I)=1
             $WLIST(I,NPATTS,NRULES)=J
810          J=3-J
          $WLIST(NRES+1,NPATTS,NRULES)=J
          V1=0.
          WRITE(IPR,760) NPATTS, LOOP1, LOOP2, ($BUF1(I),I=1,8),
     *    ($BUF2(I),I=1,8), ($WLIST(I,NPATTS,NRULES),I=1,8),V1,V1,R
          WRITE(IPR,820) ZPBUF
820       FORMAT(/1X,120A1,/1X,9('| . . . . '),/' 0         0.5     ',
     *,'   1.0       1.5       2.0       2.',
     *'5         3.0       3.5       4.0')
C SAVE; SORT & LIST VALUES IN ASC. ORDER; RESTORE ORDER
          CALL IMOVEC(VPATT(NPATTS+1,NRULES),NPATTS*4,
     *    VPATT(1,NRULES))
          CALL VSORT(VPATT(1,NRULES),INPAR(NRULES))
          CALL VSORT(VPATT(INPAR(NRULES)+1,NRULES),
     *    NPATTS-INPAR(NRULES))
          IF(IRUNSW.EQ.0) GOTO 830
C THIS CODE IS FOR PROGRAM ASTTEST3 ONLY!
          CALL VSORT(VPATT(1,NRULES),NPATTS)
          CALL IMOVEC(NELEM,NPATTS*4,VPATT(1,NRULES))
          IPAGE=NPATTS
          RETURN
830       WRITE(IPR,840) (RESV(I),I=1,NRES)
840       FORMAT(/,' SEGMENT SIZES:',/,(1X,9F8.1))
          J=INPAR(NRULES)
          WRITE(IPR,850) (VPATT(I,NRULES),I=1,J)
850       FORMAT(' SERIES VALUES:',/,(1X,9F8.1))
          J=INPAR(NRULES)+1
          WRITE(IPR,860) (VPATT(I,NRULES),I=J,NPATTS)
860       FORMAT(' PARALLEL VALUES:',/,(1X,9F8.1))
          CALL IMOVEC(VPATT(1,NRULES),NPATTS*4,
     *    VPATT(NPATTS+1,NRULES))
C RESIST, CONECTIONS USED WHEN NO BITS USED (ZERO OHMS, OPEN)
          VPATT(NPATTS+1,NRULES)=0.
          DO 870 I=1,16
870          $WLIST(I,NPATTS+1,NRULES)=0
C ALL POSSIBLE VALUES FOR 1 BAR HAVE BEEN CALCULATED. DO ACTUAL
C SYNTHESIS. STRINGS WILL CONSIST OF 0-N FULL BARS; 0 OR 1 BAR
C WHICH CAN HAVE ANY SERIAL COMBINATION OF ELEMENTS; AND 1 BAR
C WHICH CAN HAVE ANY SERIAL OR PARALLEL COMBINATION OF ELEMENTS
C SAVE CERTAIN VALUES; THEN GO BACK & GET THE NEXT &RES000 RULE
          MRES(NRULES)=NRES
          MPATTS(NRULES)=NPATTS
          GOTO 710
880       WRITE(IPR,890)
890       FORMAT(//,' --DESIRED RES-- OBTAINED RES  %ERR  #FULL ',
     *    'XBARS WIDTH  ------ ',
     *    'LAST BAR PATTERN -----  ------- MIDDLE PATTERN '
     *    ,'------')
```

Figure 21. Subroutine ABRES (3 of 5).

```
C THIS IS WHERE EXECUTION OF THIS SUBROUTINE STARTS ON SECOND
C AND SUCCEEDING CALLS. FIND THE PROPER PROTOTYPE STATEMENT
900   NRULE=0
C 8 CHARACTERS FROM ZCARD(2) MUST MATCH QASTAP(I)
      DO 910 I=1,NRULES
      IF(ICLCC(ZCARD(2),8,QASTAP(I)).NE.0) GOTO 910
C BTR NAME IS GOOD. IS THE WIDTH OK?
      IF(ICLCC(WBAR(I),3,ZCARD(15)).EQ.0) NRULE=I
C IF BTR NAME IS GOOD AND RULE NOT YET FOUND, USE CURRENT RULE
      IF(NRULE.EQ.0) NRULE=I
910   CONTINUE
      CALL IMOVEC(W,4,WBAR(NRULE))
C ALL RULES ARE CHECKED. IF NRULE =0, COULDN'T FIND PROPER RULE!
      IF(NRULE.GT.0) GOTO 930
      WRITE(IPR,920) (ZCARD(I),I=2,9), QASTAP
920   FORMAT(' ERROR -- &RES000 CARD FOR RESISTOR MODEL ',8A1,
     * ' WAS NOT FOUND.',/,1X,10A9)
      RETURN
C FIND THE PROPER BDLS STATEMENT
930   ASTAP=QASTAP(NRULE)
      DO 940 KRULE=1,NMOD
      IF(ICLCC(QBTR(NRULE),6,ZBDLS(1,KRULE)).EQ.0) GOTO 960
940   CONTINUE
      WRITE(IPR,950) QBTR(NRULE)
950   FORMAT(' ERROR -- PROTOTYPE STATEMENT FOR RESISTOR MODEL '
     * ,A8,' WAS NOT FOUND.')
      RETURN
960   NPATTS=MPATTS(NRULE)
      NSHIFT=2**(16-MRES(NRULE))
C SAVE THE REQUESTED RESISTANCE VALUE FROM THE ASTAP (XR)
      CALL IMOVEC(I,4,ZCARD(11))
C SAVE NUMBER OF PARALLELED BARS REQUESTED FROM ASTAP (XBARS)
      CALL IMOVEC(XBARS,4,ZCARD(19))
      IXBARS=XBARS
      IF(IXBARS.LE.0) IXBARS=1
C IF PARALLELED BARS ARE REQUESTED IN ASTAP, MULTIPLY DESIRED
C VALUE BY THE NUMBER OF LEGS REQUESTED. THIS WILL BE VALUE OF
C EACH PARALLELED LEG.
      VALUE=I*IXBARS
C DO THIS RESISTOR VALUE. SET UP THE INITIAL DEFAULTS FOR RES.
      NFULL=0
      NPART=0
      R=VALUE
C CALCULATE THE NUMBER OF FULL BARS REQUIRED, IF ANY
C ADD BARS UNTIL WITHIN TOLERANCE VALUE OF, OR OVER
C REQUESTED VALUE
970   IF(R.LE.(FULL(NRULE)*(1+TOL))) GOTO 980
      R=R-FULL(NRULE)
      NFULL=NFULL+1
      GOTO 970
C ISV1,2,3: VALUES USED TO DEFINE THE CLOSEST-SO-FAR RESISTANCE
C ISV1: NUMBER OF FULL BARS.
C ISV2: INDEX FOR INTERMEDIATE BAR PATTERN
C ISV3: INDEX FOR LAST BAR PATTERN
980   ROFF=999999.
      ISV1=NFULL
      ISV2=0
      ISV3=0
C QUIT WHEN FIRST VALUE IS ACHIEVED THAT IS CLOSER THAN TOLERANC
      IF(ABS(ROFF/VALUE).LT.TOL) GOTO 1020
990   DO 1000 I=1,NPATTS
      X=ABS(VPATT(I,NRULE)-R)
      IF(X.GE.(ROFF-.2)) GOTO 1000
C THIS VALUE IS CLOSER THAN THE PREVIOUSLY-DETERMINED VALUE, BUT
```

Figure 22. Subroutine ABRES (4 of 5).

```
C NOT YET WITHIN THE TOLERANCE VALUE OF REQUESTED RES. SAVE IT
            ROFF=X
            ISV1=NFULL
            ISV2=NPART
            ISV3=I
1000     CONTINUE
         IF(ABS(ROFF/VALUE).LT.TOL) GOTO 1020
C TAKE NEXT PERMUTATION OF THE MIDDLE BAR AND RECALC THE VALUES
C IF ONLY ONE BAR WAS USED, NO MORE CAN BE DONE
         IF(NFULL.EQ.0 .AND. NPART.EQ.0) GOTO 1020
C WAS THIS LOOP ALREADY STARTED FOR THIS ELEMENT?
         IF(NPART.NE.0) GOTO 1010
C NO. FIRST TIME THROUGH LOOP.
C SUBTRACT FULL BAR AND INITIALIZE VALUES.
         NFULL=NFULL-1
         RPART=FULL(NRULE)
C INCREMENT INDEX VALUE FOR THE INTERMEDIATE BAR AND TRY AGAIN.
1010  NPART=NPART+1
      R=R+RPART
C DO UNTIL ALL NON-PARALLEL (?) COMBINATIONS HAVE BEEN TRIED
C    WITH THE INTERMEDIATE BAR.
         IF(NPART.GT.NPARRL(NRULE)) GOTO 1020
         RPART=VPATT(NPART,NRULE)
         R=R-RPART
         GOTO 990
C ALL RESISTOR SEGMENT COMBINATIONS ARE CHECKED. THE TOLERANCE
C WAS ACHIEVED, OR IS IMPOSSIBLE TO ACHIEVE.  DON'T CARE!
C TOTAL R=(#FULL BARS) + (INTERMEDIATE BAR) + (LAST BAR)
1020  R=FULL(NRULE)*ISV1
      IF(ISV2.EQ.0) ISV2=NPATTS+1
      IF(ISV3.EQ.0) ISV3=NPATTS+1
      R=R+VPATT(ISV2,NRULE)
      R=R+VPATT(ISV3,NRULE)
      RERR=ABS((R-VALUE)/VALUE)*100.
C SHOW SEGMENT USAGE PATTERNS, LEFT JUSTIFIED
      $L1=LPATT1(ISV2,NRULE)*NSHIFT
      $L2=LPATT2(ISV2,NRULE)*NSHIFT
      $L3=LPATT1(ISV3,NRULE)*NSHIFT
      $L4=LPATT2(ISV3,NRULE)*NSHIFT
      CALL EXPND($L1,$BUF1,1)
      CALL EXPND($L2,$BUF2,1)
      CALL IMOVEC($BUF1(9),16,$BUF2)
      CALL EXPND($L3,$BUF2,1)
      CALL EXPND($L4,$BUF3,1)
      CALL IMOVEC($BUF2(9),16,$BUF3)
C IN LISTING || = NORMAL PARALLEL. ** = ALL SEGMENTS PARALLELED
      $=$CBAR
      $$=$CBAR
      IF(LPATT1(ISV2,NRULE).LT.0) $=$CSTAR
      IF(LPATT1(ISV3,NRULE).LT.0) $$=$CSTAR
      WRITE(IPR,1030) QASTAP(NRULE), VALUE,R,RERR,ISV1,IXBARS,W,
     * ($BUF2(I),I=1,8), $$, ($BUF2(I),I=9,16),
     * ($WLIST(I,ISV3,NRULE),I=1,8), ($BUF1(I),I=1,8), $,
     * ($BUF1(I),I=9,16), ($WLIST(I,ISV2,NRULE),I=1,8)
1030  FORMAT(1X,A7,F8.1,F10.1,F9.1,I6,I5,F8.1,2X,2(4I1),A3,1X,
     * 2(4I1),'-',2(4I1),2X,2(4I1),A3,1X,2(4I1),'-',2(4I1))
C CREATE THE BDLS STATEMENTS TO SATISFY THIS WIRING LIST REQUEST
C IF MIDDLE OR LAST BAR WAS NOT USED, SET WIRING LIST TO ZERO
      CALL ROUT(ISV1,$WLIST(1,ISV2,NRULE),$WLIST(1,ISV3,NRULE),
     *    MRES(NRULE),ZBDLS(1,KRULE),ZE,ZP,
     *    ZCARD,$WLIST(1,INPAR(NRULE),NRULE),IXBARS,NBUSED)
      RETURN
      END
```

Figure 23.   Subroutine ABRES (5 of 5).

```
      SUBROUTINE WLIST($BUF1,$BUF2,$WLIST,NSEG)
      IMPLICIT INTEGER*2($), LOGICAL*1(Z), REAL*8(Q)
      DIMENSION $BUF1(16), $BUF2(16), $WLIST(17), $WORK(16)
      COMMON IPR
C THIS SUBROUTINE LOOKS AT THE SEGMENTS SPECIFIED BY TWO ARRAYS
C     ($BUF1 AND $BUF2) AND DETERMINES WHAT THE NET NUMBER LIST
C     SHOULD BE ($WLIST) TO CONNECT THE SEGMENTS TOGETHER. NET
C     NUMBERS 1 AND 2 ARE THE EXTERNAL CONNECTIONS. NET NUMBERS
C     3-17 ARE NODES INTERNAL TO THE NETWORK.
      KSEG=NSEG+1
        DO 1110 I=1,17
1110    $WLIST(I)=0
        DO 1120 I=1,KSEG
1120    $WLIST(I)=1
      IPORT=0
C DO TWO CONNECTION LISTS, $BUF1 AND $BUF2
        DO 1170 III=1,2
        IPORT2=$WLIST(KSEG)
        IF(III.EQ.1) CALL IMOVEC($WORK,32,$BUF1)
        IF(III.EQ.2) CALL IMOVEC($WORK,32,$BUF2)
C ENSURE THAT AT LEAST ONE SEGMENT IS USED IN THIS GROUP.
C ELSE SKIP THE GROUP
        DO 1130 I=1,NSEG
        IF($WORK(I).NE.0) GOTO 1140
1130    CONTINUE
        GOTO 1160
C ASSIGN THE PORTS IN THIS GROUP
1140    DO 1150 I=2,KSEG
        IF($WORK(I-1).EQ.1) IPORT=IPORT+1
        IF(III.EQ.1 .AND. IPORT.EQ.1) IPORT=2
1150    $WLIST(I)=$WLIST(I)+IPORT
1160    IPORT=0
1170    IPORT1=$WLIST(KSEG)
C ALL PORTS ARE ASSIGNED. NOW SET THE EXTERNAL NODES 1 AND 2
        DO 1180 I=1,KSEG
        IF($WLIST(I).EQ.IPORT2) $WLIST(I)=2
1180    IF($WLIST(I).EQ.IPORT1) $WLIST(I)=1
      RETURN
      END
```

Figure 24. Subroutine WLIST.

```
      SUBROUTINE ROUT(NFULL,$WLST1,$WLST2,NRES,ZBDLS,ZE,ZP,ZCARD
     *         ,$WFULL,IXBARS,NBUSED)
      IMPLICIT INTEGER*2($), LOGICAL*1(Z), REAL*8(Q)
      DIMENSION $WLST1(17), $WLST2(17), ZBDLS(216)
      DIMENSION ZE(8), ZP(4), ZCARD(72), $WFULL(17), $WLIST(17)
      DIMENSION ZRNOD1(15), ZRNOD2(15), ZWORK(5)
      COMMON IPR, IPAGE, NELEM, ZLASCM(60),ZOUT(210),ZSHEET(216)
      COMMON $, ITHR1, ITHR2, ZCOMNT(60),NNODES, ZNODES(22,5000)
      DATA ZRNOD1/14*' ','/'/, ZRNOD2/14*' ','/'/
      DATA ZWORK/'#','0','0','0','/'/, ZB/' '/, ZCOMA/','/
C
C  THIS SUBROUTINE CREATES THE BDLS OUTPUT STATEMENTS BASED UPON
C  THE WIRING LISTS THAT ARE PASSED TO IT.
C
C    NFULL:   # OF FULL BARS IN SERIES
C    $WLST1:  NODE NUMBERS TO SHOW HOW TO CONNECT RES SEGMENTS
C             (MIDDLE BAR)
C    $WLST2:  NODE NUMBERS TO SHOW HOW TO CONNECT RES SEGMENTS
C             (LAST BAR)
C             OUTSIDE NODES ARE 1,2.  INSIDE NODES ARE 3-17
C    $WFULL:  HOW TO CONNECT A FULL BAR
C    $WLIST:  WORK BUFFER
C    NRES:    MAXIMUM NUMBER OF SEGMENTS ON A FULL BAR
C    ZBDLS:   RES PATTERN BDLS FROM DEPT287.KOEHLER.OPT(ASTBDLS)
C    ZOUT:    DUMMY BUFFER TO USE FOR SCRATCH
C    IXBARS:  NUMBER OF TIMES TO BUILD RQSTD STRING IN PARALLEL
C    ZCARD:   ORIGINAL DECODED CARD FROM AUNEST.
C             1-10="-RES J" 11-14=IRNUM 15-18=XW 19-22=XBARS
C             25-40=N1 41-56=N2
C    NBUSED:  # OF BDLS STATEMENTS NEEDED TO SATISFY ASTAP RES
      NBUSED=0
C  DO FOR THE NUMBER OF REQUESTED PARALLEL LEGS (XBARS)
      DO 1440 IXBAR=1,IXBARS
      CALL IMOVEC(ZRNOD1,14,ZCARD(25))
      CALL IMOVEC(ZRNOD2,14,ZCARD(41))
      CALL IMOVEC(ZOUT,210,ZBDLS(7))
      KFULL=NFULL
      KMID=0
      KSW=0
      KLAST=0
C  DETERMINE IF THE INTERMEDIATE AND LAST BARS ARE USED
      DO 1190 I=1,NSEG
      KMID=KMID+$WLST1(I)
1190  KLAST=KLAST+$WLST2(I)
C  SHOW NUMBER OF TIMES THE BTR WILL BE CALLED OUT
      NBUSED=NBUSED+NFULL
      IF(KMID.GT.0) NBUSED=NBUSED+1
      IF(KLAST.GT.0) NBUSED=NBUSED+1
C  WORK FROM CONNECTION LIST #1 THROUGH CONNECTION LIST #5
      NFIRST=1
      NLAST=NRES+1
1200  IF(KFULL.LE.0) GOTO 1420
C  DO A FULL BAR
      KFULL=KFULL-1
      CALL IMOVEC($WLIST,(NRES+1)*2,$WFULL)
      CALL NXTBLK(ZE,ZP)
      CALL EDITSO(ZOUT,210,'PG001#E/',ZE,I,J)
      CALL EDITSO(ZOUT,210,'#PP/',ZP,I,J)
      CALL EDITSO(ZOUT,210,'#TI/','#TI/',I,J)
      IF(I.GT.0) CALL IMOVEC(ZOUT(J),60,ZCOMNT)
C  GET THE BDLS NETNAME FOR THIS ASTAP NAME
C  KSW: WAS THE ASTAP/BDLS NAME DETERMINED YET? (0=NO, 1=YES)
1210  IF(KSW.NE.0) GOTO 1240
      KSW=1
```

Figure 25. Subroutine ROUT (1 of 4).

```
                    DO 1220 JJ=1,NNODES
                    IF(ICLCC(ZRNOD1,14,ZNODES(1,JJ)).EQ.0) GOTO 1230
1220         CONTINUE
C CREATE A NEW CORRESPONDENCE FOR THIS ASTAP NODE
             NNODES=NNODES+1
C SAVE THE ASTAP NAME
             CALL IMOVEC(ZNODES(1,NNODES),14,ZRNOD1)
C SAVE THE BDLS PAGE AND BLOCK NAME
             CALL IMOVEC(ZNODES(15,NNODES),5,ZE(3))
C SET NET CONNECTION COUNT TO ZERO
             ZNODES(22,NNODES)=0
             CALL ICVD(NFIRST,3,ZWORK(2))
             CALL EDITSO(ZOUT,210,ZWORK,ZWORK,I,J)
C SAVE THE BDLS PIN NAME
             IF(I.GT.0) CALL IMOVEC(ZNODES(20,NNODES),2,ZOUT(J-8))
             JJ=NNODES
C SUBSTITUTE BDLS NAME FOR ASTAP NAME. FROM NODE IS "ZRNOD1"
1230         CALL IMOVEC(ZRNOD1,2,'PG')
             CALL IMOVEC(ZRNOD1(3),7,ZNODES(15,JJ))
C DO A FULL BAR OR RESUME HERE AFTER STARTING INTERMEDIATE AND
C LAST BARS. IF EXTERNAL NODE 1 WAS NOT YET EQUATED, DO IT NOW
1240         IF(KSW.EQ.0) GOTO 1210
             DO 1270 I=NFIRST,NLAST
             IF($WLIST(I).NE.1) GOTO 1270
             CALL ICVD(I,3,ZWORK(2))
C DO WIRING CONNECTION #1
             CALL EDITSO(ZOUT,210,ZWORK,ZWORK,K,L)
             IF(K.GT.0) GOTO 1260
             WRITE(IPR,1250) (ZWORK(K),K=1,4), ZOUT
1250         FORMAT(' ERROR -- NODE ',4A1,' IS MISSING FROM '
     *              ,'THIS STATEMENT ',/,(1X,72A1))
             GOTO 1270
1260         CALL IMOVEC(ZOUT(L-5),9,ZRNOD1)
             ZNODES(22,JJ)=ZNODES(22,JJ)+1
1270         CONTINUE
C DO WIRING CONNECTIONS 3-17 (ALL INTERMEDIATES)
             DO 1310 J=3,17
C DETERMINE IF THIS NODE CONNECTION IS USED ONLY ONCE
C (DROPPABLE PIN)
             IDROP=0
                  DO 1280 I=NFIRST,NLAST
1280              IF($WLIST(I).EQ.J) IDROP=IDROP+J
C $ IS PIN NAME OF FIRST OCCURRENCE OF THIS INTERMEDIATE NODE
             $=0
             DO 1300 I=NFIRST,NLAST
             IF($WLIST(I).NE.J) GOTO 1300
             CALL ICVD(I,3,ZWORK(2))
C FIND WHERE THE PIN IS LOCATED ON PROTOTYPE STATEMENT
             CALL EDITSO(ZOUT,210,ZWORK,ZWORK,L,K)
             IF(L.GT.0) GOTO 1290
                 WRITE(IPR,1250) (ZWORK(K),K=1,4), ZOUT
                 GOTO 1300
1290         CALL IMOVEC(ZOUT(K-5),7,ZE)
C SAVE PIN NAME OF FIRST OCCURRENCE OF THIS INTERMEDIATE NODE #
             IF($.EQ.0) CALL IMOVEC($,2,ZOUT(K-8))
             CALL IMOVEC(ZOUT(K+2),2,$)
C IF THIS IS A SINGLE CONNECTION NET, DROP THE PIN
             IF(IDROP.NE.J) GOTO 1300
C DROP THE PIN
                 ZOUT(K-8)=ZB
                 CALL IMOVEC(ZOUT(K-7),11,ZOUT(K-8))
                 Z=ZOUT(K+4)
C IF NET NAME ENDS WITH COMMA, BLANK IT AND THE COMMA
C IF NET NAME DOESN'T END WITH ",", BLANK IT AND PRECEDING CHAR
```

Figure 26. Subroutine ROUT (2 of 4).

```
                    IF(Z.EQ.ZCOMA) ZOUT(K+4)=ZB
                    IF(Z.NE.ZCOMA) ZOUT(K-9)=ZB
1300          CONTINUE
1310       CONTINUE
C ARE ANY FULL BARS LEFT TO DO?
           IF(KFULL.GE.1) GOTO 1320
C MIDDLE BAR TO DO?
           IF(KMID.GT.0) GOTO 1320
C LAST BAR TO DO?
           IF(KLAST.GT.0) GOTO 1320
C ALL DONE. ADD THE TRAILING NODE2
           GOTO 1350
C THERE IS >= 1 MORE BAR TO DO; EITHER FULL, MIDDLE, OR LAST
C ENDING NODE OF THIS BAR WILL BE SAME AS CURRENT BLOCK/PIN
1320       $=0
C $ IS PIN NAME OF THE FIRST OCCURRENCE OF THIS ENDING NODE 2
           DO 1340 I=NFIRST,NLAST
           IF($WLIST(I).NE.2) GOTO 1340
           CALL ICVD(I,3,ZWORK(2))
C FIND WHERE THE PIN IS LOCATED ON PROTOTYPE STATEMENT
           CALL EDITSO(ZOUT,210,ZWORK,ZWORK,L,K)
           IF(L.GT.0) GOTO 1330
              WRITE(IPR,1250) (ZWORK(K),K=1,4), ZOUT
              GOTO 1340
1330       CALL IMOVEC(ZOUT(K-5),7,ZE)
           IF($.EQ.0) CALL IMOVEC($,2,ZOUT(K-8))
           CALL IMOVEC(ZOUT(K+2),2,$)
C SAVE THE BDLS PAGE-BLOCK-PIN NAME OF THE EXTERNAL CONNECTION 2
           CALL IMOVEC(ZRNOD1,9,ZOUT(K-5))
1340       CONTINUE
           WRITE(9,1410) ZOUT
           CALL IMOVEC(ZOUT,210,ZBDLS(7))
C DO THE NEXT FULL BAR, MIDDLE BAR, OR LAST BAR
           GOTO 1200
C THE IS THE LAST BAR IN THE STRING. (FULL, MIDDLE, OR LAST)
C TERMINATE THE BAR WITH THE ASTAP NET2
C GET THE BDLS NETNAME FOR THIS ASTAP NET, IF IT EXISTS
1350       DO 1360 JJ=1,NNODES
           IF(ICLCC(ZRNOD2,14,ZNODES(1,JJ)).EQ.0) GOTO 1380
1360       CONTINUE
C THIS ASTAP NODE WAS FIRST OCCURRENCE. CREATE A NEW BDLS NAME
           NNODES=NNODES+1
C SAVE THE ASTAP NAME
           CALL IMOVEC(ZNODES(1,NNODES),14,ZRNOD2)
C SAVE THE BDLS PAGE AND BLOCK NAME
           CALL IMOVEC(ZNODES(15,NNODES),5,ZE(3))
C SET NET CONNECTION COUNT TO ZERO
           ZNODES(22,JJ)=0
           DO 1370 I=NFIRST,NLAST
1370       IF($WLIST(I).EQ.2) CALL ICVD(I,3,ZWORK(2))
           CALL EDITSO(ZOUT,210,ZWORK,ZWORK,I,J)
C SAVE THE BDLS PIN NAME
           IF(I.GT.0) CALL IMOVEC(ZNODES(20,NNODES),2,ZOUT(J-8))
           JJ=NNODES
C SUBSTITUTE THE BDLS NAME
1380       CALL IMOVEC(ZRNOD2,2,'PG')
           CALL IMOVEC(ZRNOD2(3),7,ZNODES(15,JJ))
C INSERT BDLS NET NAME INTO RESISTOR BDLS STATEMENT FOR NODE2
           DO 1400 I=NFIRST,NLAST
           IF($WLIST(I).NE.2) GOTO 1400
           CALL ICVD(I,3,ZWORK(2))
C DO WIRING CONNECTION #2
           CALL EDITSO(ZOUT,210,ZWORK,ZWORK,K,L)
           IF(K.GT.0) GOTO 1390
```

Figure 27. Subroutine ROUT (3 of 4).

```
                    WRITE(IPR,1250) (ZWORK(K),K=1,4), ZOUT
                    GOTO 1400
1390        CALL IMOVEC(ZOUT(L-5),9,ZRNOD2)
C INCREMENT THE NETNAME CONNECTION COUNT
            ZNODES(22,JJ)=ZNODES(22,JJ)+1
1400        CONTINUE
            WRITE(9,1410) ZOUT
1410        FORMAT(72A1)
            CALL IMOVEC(ZOUT,210,ZBDLS(7))
            GOTO 1440
C ALL FULL BARS ARE DONE. CHECK FOR THE MIDDLE BAR USED
1420        IF(KMID.EQ.0) GOTO 1430
C INTERMEDIATE BAR IS REQUIRED. GET ITS BLOCK NAME + WIRING LIST
C    THEN GO UP AND WIRE IT
            CALL NXTBLK(ZE,ZP)
            CALL EDITSO(ZOUT,210,'PG001#E/',ZE,I,J)
            CALL EDITSO(ZOUT,210,'#PP/',ZP,I,J)
            CALL EDITSO(ZOUT,210,'#TI/','#TI/',I,J)
            IF(I.GT.0) CALL IMOVEC(ZOUT(J),60,ZCOMNT)
            KMID=0
            CALL IMOVEC($WLIST,(NRES+1)*2,$WLST1)
            GOTO 1240
C ALL FULL BARS ARE DONE. CHECK FOR THE LAST BAR USED
1430        IF(KLAST.EQ.0) GOTO 1440
C THE LAST BAR IS REQUIRED. GET ITS BLOCK NAME AND WIRING LIST
C    THEN GO UP AND WIRE IT
            CALL NXTBLK(ZE,ZP)
            CALL EDITSO(ZOUT,210,'PG001#E/',ZE,I,J)
            CALL EDITSO(ZOUT,210,'#PP/',ZP,I,J)
            CALL EDITSO(ZOUT,210,'#TI/','#TI/',I,J)
            IF(I.GT.0) CALL IMOVEC(ZOUT(J),60,ZCOMNT)
            KLAST=0
            CALL IMOVEC($WLIST,(NRES+1)*2,$WLST2)
            GOTO 1240
1440    CONTINUE
        RETURN
        END
```

Figure 28.   Subroutine ROUT (4 of 4).

```
        SUBROUTINE VSORT(VAL,NUM)
        IMPLICIT INTEGER*2($), LOGICAL*1(Z), REAL*8(Q)
        DIMENSION VAL(10)
C
        K=NUM-1
        IF(NUM.LE.1) RETURN
            DO 20 I=1,K
            L=I+1
            X=VAL(I)
                DO 10 J=L,NUM
                IF(X.LE.VAL(J)) GO TO 10
                VAL(I)=VAL(J)
                VAL(J)=X
                X=VAL(I)
10              CONTINUE
20          CONTINUE
        RETURN
        END
```

Figure 29.   Subroutine VSORT.

```
C*****************************************************************
C TITLE/DESCRIPTION: ASTAP TO BDLS CONVERTER WITH DWARF
C*****************************************************************
      IMPLICIT INTEGER*2($), LOGICAL*1(Z), REAL*8(Q)
      REAL ZBARS
      DIMENSION ZBDLS(216,200), $CNT(200), ZMODL(6)
      DIMENSION ZNA(10), ZNB(10)
      DIMENSION ZE(8), ZN(10), ZP(4),ZN2(10),ZNODE(14),ZWORK(14)
      DIMENSION KBARS(50),ZBARS(65,65),RVAL(500),ZBTR(3,500),
      DIMENSION IBYTE(500),ZCARD(72),NXBAR(500)
      COMMON IPR,IPAGE,NELEM, ZLASCM(20),ZOUT(210),ZSHEET(216),$
      COMMON ITHR1,ITHR2,ZCOMNT(20),NNODES,ZNODES(22,5000),NVAL
      DATA ZE/'P','G','0','0','0','X','X','/'/
      DATA ZN/'P','G','0','0','1','#',' ',' ',' ','/'/
      DATA QB/' '/, ZP/' ',' ',' ','/'/
      DATA ZN2/' ',' ',' ',' ',' ',' ',' ',' ',' ',' ','/'/
      DATA ZLEFT/'('/, ZRIGHT/')'/, ZSTAR/'*'/
      DATA ZNA/'#','A','S','T','A','P',3*0,'/'/, ZNB/9*' ','/'/
      DATA ZCOMA/','/, ZEQ/'='/, ZQUOT/''''/, ZB/' '/
      DATA ZMNUS/'-'/
C ZNODES(1-14,): ASTAP NET NAME.
C        (15-21,): BDLS NET NAME (W/O "PG")
C        (22,): NUMBER OF CONNECTIONS TO THIS NET
      IPR=5
C SET THE HEADING INFORMATION FOR RESISTOR CROSS LISTING
      WRITE(IPR,10)
10    FORMAT(' ASTAP MODEL         RES VAL    # OF FULL BARS(',
     *  'BTR)    VALUE/BTR OF PARTIAL BAR')
      WRITE(2,20)
20    FORMAT(1X,'BTR',4X,'RES VALUE',2X,'BAR TYPE',2X,
     *  'NO OF SEGMENTS')
      WRITE(7,30)
30    FORMAT(1X,'GL BNFORM=#;')
      DO 40 I=1,20
      ZCOMNT(I)=ZB
40    ZLASCM(I)=ZB
      NVAL=0
      IPAGE=0
      NMOD=0
      NNODES=0
      $BINDX=0
      ITHR1=30
      ITHR2=253
C GET THE NEXT BDLS TRANSLATION (PROTOTYPE) STATEMENT
50    READ(36,60,END=80) (ZBDLS(I,NMOD+1),I=1,216)
60    FORMAT(72A1)
      NMOD=NMOD+1
      $CNT(I)=0
C SAVE LOCATIONS OF BUNDLE AND SHEET PROTOTYPE STATEMENTS
C FOR QUICK USE
      IF(ICLCC(ZBDLS(1,NMOD),6,'BU    ').EQ.0
     *                      .AND. $BINDX.EQ.0) $BINDX=NMOD
      IF(ICLCC(ZBDLS(1,NMOD),6,'SHEET ').EQ.0)
     *                CALL IMOVEC(ZSHEET,216,ZBDLS(1,NMOD))
C ALLOW UP TO 200 PROTOTYPE STATEMENTS
      IF(NMOD.LT.200) GO TO 50
      WRITE(IPR,70)
70    FORMAT(' ERROR - BDLS MODELS EXCEED 200')
      STOP
C ALL TRANSLATION STATEMENTS ARE READ; GET THE USCASTAP
80    NELEM=0
C READ IN THE RESISTOR RULES
      CALL GETNO(NWDTS,KBARS,ZBARS)
C GET ONE USCASTAP STATEMENT
```

Figure 30. Variable-value mainline (1 of 6).

```
90      READ(8,60,END=390) ZCARD
        IF(ZCARD(1).NE.ZMNUS) GO TO 100
C PROCESS A CHAINED RESISTOR.
        CALL RESVL(ZBARS,ZCARD,ZBDLS,ZE,ZP,NVAL,KBARS,
     *         NMOD,RVAL,ZBTR,IBTYE,ISET,KRULE,NBUSED,NWDTS,NXBAR)
C
100     IPTR=1
        CALL GETN(ZNODE,ZCARD,IPTR)
        IF(ZNODE(1).EQ.ZB) GOTO 90
C IF A "*" CARD, SAVE COMMENTS. WILL BECOME PART OF "TI" FIELD
        IF(ZNODE(1).NE.ZSTAR) GO TO 130
C IF A "**" CARD, THROW IT
        IF(ZNODE(2).EQ.ZSTAR) GO TO 90
        CALL IMOVEC(ZCOMNT,20,ZCARD(3))
C FIND THE PERIOD, IF ANY, IN THIS COMMENT CARD.
C INFORMATION AFTER THE FIRST PERIOD IS THE TITLE OF THE SHEET
        CALL EDITSO(ZCOMNT,20,'./','./',I,J)
        IF(I.LE.0) GO TO 90
C PERIOD PRESENT. IS NESTED NAME LIST (SHEET TITLE) DIFFERENT?
        N=20-J
C IF YOU WANT THE NET NAMES TO BE CHECKED AGAINST THE APW LIMIT
C OF 124 AFTER EACH ELEMENT THEN GOTO 136 ON THE NEXT STATEMENT
C IF YOU WANT THE NET NAMES TO BE CHECKED AGAINST THE APW LIMIT
C OF 124 AFTER EACH MACRO THEN GOTO 90 ON THE NEXT STATEMENT
        IF(ICLCC(ZLASCM(1),N,ZCOMNT(J+1)).EQ.0) GO TO 110
C NAME LIST CHANGED. START A NEW PAGE
        NELEM=676
C SAVE THE NESTED NAME LIST (SHEET TITLE)
        CALL IMOVEC(ZLASCM,1,ZB)
        CALL IMOVEC(ZLASCM(2),19,ZLASCM)
        CALL IMOVEC(ZLASCM,N,ZCOMNT(J+1))
        CALL NXTBLK(ZE,ZP)
C LOOK FOR ANY NODES USED MORE THAN THE MAXIMUM APW LIMIT (124)
C IF ANY ARE OVER, ZERO THE 9TH CHARACTER OF THE ASTAP NET NAME,
C SO THAT NO MORE CONECTIONS WILL BE MADE TO IT. THESE NETS WILL
C BE FLAGGED AT THE END OF THE PROGRAM AND WILL HAVE TO BE
C MANUALLY FIXED UP AFTER IGW IS USED TO DO ALL OVERFLOWS.
110     DO 120 I=1,NNODES
        IF(ZNODES(22,I).LT.ITHR2) GO TO 120
        ZNODES(14,I)=0
120     CONTINUE
C ALL DONE WITH THE "*" CARD. BET THE NEXT USCASTAP STATEMENT
        GO TO 90
C IF THIS USCASTAP IS AN "END" CARD, TERMINATE
130     IF(ICLCC(ZNODE,6,'END    ').EQ.0) GO TO 390
C FIND THE BDLS TRANSLATION STMT FOR THIS USCASTAP MODEL
        DO 140 II=1,NMOD
        IF(ICLCC(ZNODE,6,ZBDLS(1,II)).EQ.0) GO TO 190
140     CONTINUE
C THIS USCMODEL WAS NOT FOUND IN THE FT01F001 PROTOTYPE DATA SET
C SHOULD A BUNDLE STATEMENT BE PROVIDED?
        IF($BINDX.EQ.0) GO TO 170
        IF(ZCARD(IPTR).NE.ZLEFT) GO TO 170
C DETERMINE IF ONLY ONE NET IS PRESENT; IF MORE, ERROR
        JPTR=IPTR+1
        CALL GETN(ZWORK,ZCARD,JPTR)
        IF(ZCARD(JPTR).NE.ZRIGHT) GO TO 170
C ONE NET IS DEFINED; CREATE A BUNDLE STATEMENT
        CALL IMOVEC(ZOUT,210,ZBDLS(7,$BINDX))
C INSERT THE ASTAP MODEL NAME IN THE BUNDLE STATEMENT
        CALL IMOVEC(ZNODE(7),1,'/')
        CALL EDITSO(ZOUT,210,'#MODEL/',ZNODE,I,J)
C INSERT THE ASTAP NET NAME IN THE BUNDLE STATEMENT
        Z=ZWORK(10)
```

Figure 31. Variable-value mainline (2 of 6).

```
            CALL IMOVEC(ZWORK(10),1,'/')
            CALL EDITSO(ZOUT,210,'#ASTAP001/',ZWORK,I,J)
            ZWORK(10)=Z
C INSERT THE BDLS NET NAME IN THE BUNDLE STATEMENT
            DO 150 JJ=1,NNODES
            IF(ICLCC(ZWORK,14,ZNODES(1,JJ)).EQ.0) GO TO 160
150         CONTINUE
C ASTAP/BDLS NETNAME CORRESPONDENCE DOESN'T EXIST-COPY ASTAP NET
            NNODES=NNODES+1
            JJ=NNODES
            CALL IMOVEC(ZNODES(1,JJ),14,ZWORK)
            CALL IMOVEC(ZNODES(15,JJ),7,ZWORK)
            ZNODES(22,JJ)=0
160         CALL IMOVEC(ZWORK(3),7,ZNODES(15,JJ))
            CALL IMOVEC(ZWORK(1),2,'PG')
            CALL EDITSO(ZOUT,210,'PG001#001/',ZWORK,I,J)
            ZNODES(22,JJ)=ZNODES(22,JJ)+1
C OUTPUT THE BUNDLE STATEMENT
            GO TO 370
C UNDEFINED MODEL HAS 2 OR MORE NODES. CAN'T BE A BUNDLE STMT.
170         WRITE(IPR,180) ZNODE, IPTR, ZCARD
180         FORMAT(' UNDEFINED MODEL: ',14A1,' NEAR COLUMN',I3,
     *      ' ON THIS CARD:',/,1X,72A1)
            GO TO 90
C BUILD PG001## AND PP=##X VALUES AND INSERT THEM INTO BDLS STMT
190         CALL NXTBLK(ZE,ZP)
C ADD 1 TO THE USAGE OF THIS TYPE
            $CNT(II)=$CNT(II)+1
C SAVE THE PROPER PROTOTYPE STATEMENT
            CALL IMOVEC(ZOUT,210,ZBDLS(7,II))
C INSERT THE PROPER (NEXT AVAILABLE) BLOCK NAME
            CALL EDITSO(ZOUT,210,'PG001#E/',ZE,I,J)
            IF(I.NE.0) GO TO 210
            WRITE(IPR,200)
200         FORMAT(' ERROR - #E WAS NOT FOUND')
            GO TO 90
C INSERT THE PROPER (NEXT AVAILABLE) PRINT POSITION
210         CALL EDITSO(ZOUT,210,'#PP/',ZP,I,J)
            IF(I.NE.0) GO TO 230
            WRITE(IPR,220)
220         FORMAT(' ERROR - #PP WAS NOT FOUND')
            GO TO 90
C
C DO ALL OF THE NODES ON THIS USCASTAP STATEMENT
230         DO 350 III=1,20
C #001 #002 #003...
C BUILD THE "FIND" STRING... (PG001#00X)
            CALL ICVD(III,3,ZN(7))
            CALL IMOVEC(ZNA(7),3,ZN(7))
            ZLCH=ZCARD(IPTR)
            IPTR=IPTR+1
            IF(IPTR.LT.72) GO TO 240
            IF(ZLCH.EQ.ZCOMA) GO TO 250
C GET THE NEXT NET NAME
240         CALL GETN(ZNODE,ZCARD,IPTR)
            IF(ICLCC(ZNODE,8,QB).NE.0) GO TO 260
C LAST NET NAME CAME OUT BLANK. (LAST NET ON CARD ALREADY READ)
C IF LAST NON-BLANK CHAR WAS ',' THEN READ ANOTHER
C (CONTINUATION CARD)
            IF(ZLCH.NE.ZCOMA) GO TO 350
C IT WAS A COMMA.
250         READ(8,60) ZCARD
            IPTR=1
            GO TO 240
```

Figure 32. Variable-value mainline (3 of 6).

```
C FIND THIS USCASTAP NETNAME IN THE ASTAP/BDLS NETNAME
C EQUIVALENCE LIST
260         DO 270 JJ=1,NNODES
            IF(ICLCC(ZNODE,14,ZNODES(1,JJ)).EQ.0) GO TO 320
270         CONTINUE
C NET NAME WAS FOUND; USE PG001## AND PIN ID TO GET ##10, ##A1,.
            NNODES=NNODES+1
            IF(NNODES.LT.5000) GO TO 290
            WRITE(IPR,280)
280         FORMAT(' ERROR - NETNAMES EXCEED 5000')
            STOP
C CREATE A NEW ENTRY IN THE ASTAP/BDLS NETNAME EQUIV LIST.
C THIS IS THE FIRST OCCURRENCE OF THE ASTAP NET NAME
            JJ=NNODES
290     JJ=NNODES
C SAVE ORIGINAL USCASTAP NET NAME & BDLS BLOCK NAME: PG001##
            CALL IMOVEC(ZNODES(1,JJ),14,ZNODE)
            CALL IMOVEC(ZNODES(15,JJ),5,ZE(3))
C SET THE NETNAME CONNECTION COUNT TO ZERO
            ZNODES(22,JJ)=0
C FIND THE CHARACTER COLUMN WHERE THIS NET NAME EXISTS IN BDLS
            CALL EDITSO(ZOUT,210,ZN,ZN,K,L)
            IF(K.GT.0) GO TO 310
C #001 WAS NOT FOUND; LOOK FOR #ASTAP INSTEAD
            CALL EDITSO(ZOUT,210,ZNA,ZNA,K,L)
            WRITE(IPR,300) (ZNA(I),I=1,9), ZOUT
300         FORMAT(' ERROR -- ',9A1,' WAS NOT FOUND ON THIS CARD.',
     *      /,(120A1))
C SAVE THE I/O PIN OF THIS BLOCK  10, A1, A2,...
310         CALL IMOVEC(ZNODES(20,JJ),2,ZOUT(L-3))
C COPY THE PAGE-BLOCK-PIN STRING INTO THE "REPLACE" WORK BUFFER
320         CALL IMOVEC(ZN2(3),7,ZNODES(15,JJ))
            CALL IMOVEC(ZN2(1),2,'PG')
C CHANGE THE #001, #002, #003 ... NODES
            CALL EDITSO(ZOUT,210,ZN,ZN2,I,J)
            ZNODES(22,JJ)=ZNODES(22,JJ)+I
            K=I
C CHANGE THE #ASTAP001, #ASTAP002, #ASTAP003 ... NODES
            CALL IMOVEC(ZNB,9,ZNODE)
            CALL EDITSO(ZOUT,210,ZNA,ZNB,I,J)
            ZNODES(22,JJ)=ZNODES(22,JJ)+I
            K=K+I
C ERROR IF THE PIN WAS NOT DEFINED ON THE BDLS SAMPLE STATEMENTS
            IF(K.NE.0) GO TO 350
330         WRITE(IPR,340) (ZN2(I),I=1,9), (ZN(I),I=1,9),ZCARD,ZOUT
340         FORMAT(' NETNAME SUBSTITUTION ERROR ("',9A1,'" FOR "',
     *       9A1,'") ON THESE STATEMENTS:',/,10X,'ASTAP:   ',72A1,
     *      /,(10X,'BDLS:    ',72A1))
            GO TO 90
C DO EVERY ASTAP NODE
350     CONTINUE
C INSERT TITLE FIELD INTO THE STATEMENT (FROM PREVIOUS "*" CARD)
        CALL EDITSO(ZOUT,210,'#TI/','#TI/',I,J)
        IF(I.LE.0) GO TO 370
C REPLACE BLANK CHARACTERS UNTIL QUOTE IS FOUND IN #TI FIELD
            DO 360 I=1,20
            CALL IMOVEC(ZOUT(J),1,ZCOMNT(I))
            J=J+1
            IF(ZOUT(J).EQ.ZQUOT) GO TO 370
360         CONTINUE
C ENSURE EVERY "#" WAS REPLACED ON CARD. PROGRAM ERROR IF NOT
370     CALL EDITSO(ZOUT,210,'#/','#/',I,J)
            IF(I.NE.0) GO TO 330
C THE BDLS CARD IS COMPLETE AND GOOD; SAVE IT
        WRITE(7,380) ZOUT
```

Figure 33.    Variable-value mainline (4 of 6).

```
380     FORMAT(72A1)
C ERASE THE #TI FIELD FOR THE NEXT ELEMENT
        ZCOMNT(1)=ZB
        CALL IMOVEC(ZCOMNT(2),19,ZCOMNT)
        GO TO 90
C ALL USCASTAP STATEMENTS ARE CONVERTED.
C LIST USAGE AND WARNING INFO
390     WRITE(IPR,400)
400     FORMAT(//,' ASTAP/BOOK-NAME    TIMES-USED')
        NTOT=0
C LIST # OF TIMES EACH PROTOTYPE NAME (BTR) WAS REFERENCED
        DO 480 I=1,NMOD
        IF($CNT(I).LE.0) GO TO 480
        CALL IMOVEC(ZBDLS(7,I),8,QB)
C FIND THE "==" IN THE PROTOTYPE STATEMENT
        DO 410 J=9,206
        IF(ZBDLS(J,I).EQ.ZEQ .AND. ZBDLS(J+1,I).EQ.ZEQ)
     *                                         GO TO 420
410         CONTINUE
420     J=J+2
C SKIP PAST THE COMMA THAT IS AFTER ==
        DO 430 K=1,8
        J=J+1
        IF(ZBDLS(J-1,I).EQ.ZCOMA) GO TO 440
430         CONTINUE
C SAVE UP TO 8 CHARACTERS OR UNTIL COMMA IS FOUND
440     DO 450 K=7,14
        CALL IMOVEC(ZBDLS(K,I),1,ZBDLS(J,I))
        J=J+1
        IF(ZBDLS(J,I).EQ.ZCOMA) GO TO 460
450         CONTINUE
C LIST ASTAP/BTR/USAGE INFORMATION FOR THIS PROTOTYPE STATEMENT
460     WRITE(IPR,470) (ZBDLS(J,I),J=1,14), $CNT(I)
470     FORMAT(1X,6A1,1X,8A1,I8)
        NTOT=NTOT+$CNT(I)
480         CONTINUE
C LIST THE TOTAL NUMBER OF MODELS/BTRS USED
        WRITE(IPR,490) NTOT
490     FORMAT(20X,'----',/,16X,I8,//)
C SUM VALUES FOR EACH BOOK NAME. USEFUL FOR WHEN 2 OR MORE ASTAP
C    MODELS USE THE SAME BTR NAME IN THEIR PROTOTYPE STATEMENTS
        DO 510 I=1,NMOD
        IF($CNT(I).LE.0) GO TO 510
        J=I-1
        IF(J.LE.0) GO TO 510
        DO 500 K=1,J
        IF(ICLCC(ZBDLS(7,K),8,ZBDLS(7,I)).NE.0) GO TO 500
C SAME NAME
        $CNT(K)=$CNT(K)+$CNT(I)
        $CNT(I)=0
500         CONTINUE
510     CONTINUE
C LIST OUT THE INFORMATION JUST COLLECTED ABOVE.
        DO 530 I=1,NMOD
        IF($CNT(I).LE.0) GO TO 530
        WRITE(IPR,520) (ZBDLS(J,I),J=7,14), $CNT(I)
520     FORMAT(1X,6X,1X,8A1,I8)
530         CONTINUE
        WRITE(IPR,490) NTOT
C LIST THOSE NETS WHICH HAVE MORE THAN 30 CONNECTIONS
        WRITE(IPR,540) ITHR1
540     FORMAT(' THESE NETS HAVE MORE THAN',I4,' CONNECTIONS',
     *     /,' ASTAP       BDLS      #CONNECTIONS',/)
C ONLY LIST THOSE BETWEEN 30 - 90 CONNECTIONS HERE.
```

Figure 34. Variable-value mainline (5 of 6).

```
C OVER 90 COMES LATER
      DO 550 J=1,NNODES
550     IF(ZNODES(22,J).GT.ITHR1 .AND. ZNODES(22,J).LT.ITHR2)
    *                 WRITE(IPR,640) (ZNODES(I,J),I=1,22)
C LIST NETS WHICH EXCEEDED MAX NUMBER OF CONNECTIONS FOR APW
      K=0
      ICONN=0
      DO 590 I=1,NNODES
      JJ=ZNODES(22,I)
      IF(JJ.GE.2) ICONN=ICONN+JJ-1
      IF(ZNODES(14,I).NE.0) GO TO 570
C THIS NODE MUST BE LISTED
560     K=K+1
      CALL IMOVEC(ZNODES(1,K),22,ZNODES(1,I))
      GO TO 590
C SHOULD THIS NODE ALSO BE LISTED?
C (IS ASTAP = ANY OTHER LISTED NODE?)
570     IF(K.EQ.0) GO TO 590
      DO 580 J=1,K
580     IF(ICLCC(ZNODES(1,J),13,ZNODES(1,I)).EQ.0) GO TO 560
590     CONTINUE
      IF(K.EQ.0) GO TO 650
      WRITE(IPR,600)
600   FORMAT(/,' WARNING -- THESE NETS EXCEED (OR ARE CLOSE TO)'
    * ,' THE MAXIMUM NUMBER OF CONNECTIONS FOR APW',/,
    * ' ASTAP      BDLS       #CONNECTIONS',/)
C SORT THE LARGE NETS BY NAME AND LIST THEM
C WITH TOTALS FOR EACH GROUP OF PIECES
      DO 630 I=1,K
      M=ZNODES(22,I)
      IF(M.EQ.0) GO TO 630
      WRITE(IPR,640) (ZNODES(J,I),J=1,22)
      IF(I.GE.K) GO TO 630
      L=I+1
C FIND ALL OTHER PIECES WITH THIS SAME NAME AND LIST THEM NOW
      DO 610 J=L,K
      IF(ICLCC(ZNODES(1,I),13,ZNODES(1,J)).NE.0) GO TO 610
      WRITE(IPR,640) (ZNODES(N,J),N=1,22)
      M=M+ZNODES(22,J)
      ZNODES(22,J)=0
610     CONTINUE
      WRITE(IPR,620) M
620   FORMAT(29X,'----',/,29X,I4,/)
630   CONTINUE
640   FORMAT(1X,14A1,2X,'PG',7A1,I7)
650   WRITE(IPR,660) NNODES, ICONN
660   FORMAT(/,1X,I5,' TOTAL NETS AND',I7,' TOTAL CONNECTIONS.')
      CALL GL1GEN(KBARS,ZBARS,RVAL,ZBTR,IBTYE,NVAL,NWDTS,NXBAR)
      STOP
      END
```

Figure 35. Variable-value mainline (6 of 6).

```
      SUBROUTINE ROUTL(NFULL,NPART,ZBDLS,ZE,ZP,ZCARD,IXBARS,
     *  NBUSED,ZBTRFL,ZBTRPT,KNOSEG,ISEC)
      IMPLICIT INTEGER*2($), LOGICAL*1(Z), REAL*8(Q)
      DIMENSION ZE(8), ZP(4), ZBDLS(216), ZCARD(72)
      DIMENSION ZRNOD1(15), ZRNOD2(15), ZWORK(5)
      DIMENSION ZBTRPT(3), ZBTRFL(3) ,ZOUT2(210),ZND(3),ZNOD(13)
      DIMENSION KNOSEG(16)
      COMMON IPR,IPAGE,NELEM, ZLASCM(20),ZOUT(210),ZSHEET(216),$
      COMMON ITHR1,ITHR2,ZCOMNT(20), NNODES,ZNODES(22,5000),NVAL
      DATA ZRNOD1/14*' ','/'/, ZRNOD2/14*' ','/'/
      DATA ZWORK/'#','0','0','0','/'/, ZB/' '/, ZCOMA/',','/
      DATA ZNOD/'A','1','B','1','C','1','D','1','E','1','F','1',
     *  '/'/
C
C   THIS SUBROUTINE CREATES THE BDLS OUTPUT STATEMENTS BASED UPON
C   THE WIRING LISTS THAT ARE PASSED TO IT.
C
C   NFULL:   # OF FULL BARS IN SERIES
C   ZBDLS:   RES PATTERN BDLS FROM DEPT453.KOEHLER.OPT(ASTBDLS)
C   ZOUT:    DUMMY BUFFER TO USE FOR SCRATCH
C   IXBARS:  NUMBER OF TIMES TO BUILD REQUESTED STRING IN PARALEL
C   ZCARD:   ORIGINAL DECODED CARD FROM AUNEST.
C            1-10="-RES J" 11-14=IRNUM  15-18=XW   19-22=XBARS
C            25-40=N1   41-56=N2
C   NBUSED:  NUMBER OF BDLS STMTS NEEDED TO SATISFY ASTAP RES
C   KNOSEG:  THE NUMBER OF SEGMENTS PER BAR
      NBUSED=0
      NCON=0
C SET UP THE PROTOTYPE FOR THE CORRECT NUMBER OF NODES
      IF(IXBARS.LT.0) NCON=KNOSEG(ISEC)
      IF(IXBARS.GE.1) NCON=1
      NCON=(2*(NCON+1))+1
      NCON2=NCON+1
      CALL IMOVEC(ZOUT2,210,ZBDLS(7))
      CALL IMOVEC(ZND(1),1,ZNOD(NCON))
      CALL IMOVEC(ZND(2),1,ZNOD(NCON2))
      CALL IMOVEC(ZND(3),1,ZNOD(13))
      CALL EDITSO(ZOUT2,210,ZND,ZND,I,N)
      CALL EDITSO(ZOUT2,210,'::PP=/','::PP=/',I,M)
      N=N-1
      M=M-2
         DO 840 J=N,M
            CALL IMOVEC(ZOUT2(J),1,ZB)
840      CONTINUE
      IF(IXBARS.LT.0) GO TO 850
C DO FOR THE NUMBER OF REQUESTED PARALLEL LEGS (XBARS)
         DO 1060 IXBAR=1,IXBARS
850      CALL IMOVEC(ZRNOD1,14,ZCARD(25))
         CALL IMOVEC(ZRNOD2,14,ZCARD(41))
         CALL IMOVEC(ZOUT,210,ZOUT2)
         KFULL=NFULL
         KPART=NPART
         KSW=0
C SHOW NUMBER OF TIMES THE BTR WILL BE CALLED OUT
         NBUSED=NBUSED+NFULL
         IF(KPART.GT.0) NBUSED=NBUSED+1
C
860      IF(KFULL.LE.0) GO TO 1050
C DO A FULL BAR
         KFULL=KFULL-1
         CALL NXTBLK(ZE,ZP)
         CALL EDITSO(ZOUT,210,'PG001#E/',ZE,I,J)
         CALL EDITSO(ZOUT,210,'#PP/',ZP,I,J)
         CALL EDITSO(ZOUT,210,'#TI/','#TI/',I,J)
```

Figure 36.   Subroutine ROUTL (1 of 3).

```
              IF(I.GT.0) CALL IMOVEC(ZOUT(J),20,ZCOMNT)
              CALL EDITSO(ZOUT,210,'R##/','R##/',L,M)
              CALL IMOVEC(ZOUT(M),3,ZBTRFL)
C GET THE BDLS NETNAME FOR THIS ASTAP NAME
C KSW: WAS THE ASTAP/BDLS NAME DETERMINED YET? (0=NO, 1=YES)
870           IF(KSW.NE.0) GO TO 900
              KSW=1
              DO 880 II=1,NNODES
                IF(ICLCC(ZRNOD1,14,ZNODES(1,II)).EQ.0) GO TO 890
880           CONTINUE
C CREATE A NEW CORRESPONDENCE FOR THIS ASTAP NODE
              NNODES=NNODES+1
C SAVE THE ASTAP NAME
              CALL IMOVEC(ZNODES(1,NNODES),14,ZRNOD1)
C SAVE THE BDLS PAGE AND BLOCK NAME
              CALL IMOVEC(ZNODES(15,NNODES),5,ZE(3))
C SET NET CONNECTION COUNT TO ZERO
              ZNODES(22,NNODES)=0
              CALL ICVD(1,3,ZWORK(2))
              CALL EDITSO(ZOUT,210,ZWORK,ZWORK,I,J)
C SAVE THE BDLS PIN NAME
              IF(I.GT.0) CALL IMOVEC(ZNODES(20,NNODES),2,ZOUT(J-8))
              II=NNODES
C SUBSTITUTE BDLS NAME FOR ASTAP NAME. THE FROM NODE IS "ZRNOD1"
890           CALL IMOVEC(ZRNOD1,2,'PG')
              CALL IMOVEC(ZRNOD1(3),7,ZNODES(15,II))
C DO A FULL BAR
C OR RESUME HERE AFTER STARTING INTERMEDIATE AND LAST BARS
C IF EXTERNAL NODE 1 WAS NOT YET EQUATED, DO IT NOW
900           IF(KSW.EQ.0) GO TO 870
              CALL ICVD(1,3,ZWORK(2))
C DO WIRING CONNECTION #1
              CALL EDITSO(ZOUT,210,ZWORK,ZWORK,K,L)
              IF(K.GT.0) GO TO 920
              WRITE(IPR,910) (ZWORK(K),K=1,4), ZOUT
910           FORMAT(' ERROR -- NODE ',4A1,' IS MISSING FROM ',
     *               'THIS STATEMENT ',/,(1X,72A1))
              GO TO 940
C ADD ALL NODE NAMES
920           DO 930 N=1,K
                CALL EDITSO(ZOUT,210,ZWORK,ZWORK,KK,L)
                IF(KK.EQ.0) GO TO 940
                CALL IMOVEC(ZOUT(L-5),9,ZRNOD1)
930           CONTINUE
              ZNODES(22,II)=ZNODES(22,II)+1
940           CONTINUE
C ARE ANY FULL BARS LEFT TO DO?
              IF(KFULL.GE.1) GO TO 950
C LAST BAR TO DO?
              IF(KPART.NE.0) GO TO 950
C ALL DONE. ADD THE TRAILING NODE2
              GO TO 980
C THERE IS >= 1 MORE BAR TO DO; EITHER FULL, MIDDLE, OR LAST
C ENDING NODE OF THIS BAR WILL BE SAME AS CURRENT BLOCK/PIN
950           $=0
C $ IS PIN NAME OF THE FIRST OCCURRENCE OF THIS ENDING NODE 2
              CALL ICVD(2,3,ZWORK(2))
C FIND WHERE THE PIN IS LOCATED ON PROTOTYPE STATEMENT
              CALL EDITSO(ZOUT,210,ZWORK,ZWORK,L,K)
              IF(L.GT.0) GO TO 960
                WRITE(IPR,910) (ZWORK(K),K=1,4), ZOUT
                GO TO 970
960           CALL IMOVEC(ZOUT(K-5),7,ZE)
              IF($.EQ.0) CALL IMOVEC($,2,ZOUT(K-8))
```

Figure 37.    Subroutine ROUTL (2 of 3).

```
              CALL IMOVEC(ZOUT(K+2),2,$)
C SAVE THE BDLS PAGE-BLOCK-PIN NAME OF THE EXTERNAL CONNECTION 2
              CALL IMOVEC(ZRNOD1,9,ZOUT(K-5))
970           CONTINUE
              WRITE(7,1040) ZOUT
              CALL IMOVEC(ZOUT,210,ZOUT2)
C DO THE NEXT FULL BAR, MIDDLE BAR, OR LAST BAR
              GO TO 860
C THE IS THE LAST BAR IN THE STRING. (FULL, MIDDLE, OR LAST)
C TERMINATE THE BAR WITH THE ASTAP NET2
C GET THE BDLS NETNAME FOR THIS ASTAP NET, IF IT EXISTS
980           DO 990 II=1,NNODES
                 IF(ICLCC(ZRNOD2,14,ZNODES(1,II)).EQ.0) GO TO 1000
990           CONTINUE
C THIS ASTAP NODE WAS THE FIRST OCCURRENCE. CREATE NEW BDLS NAME
              NNODES=NNODES+1
C SAVE THE ASTAP NAME
              CALL IMOVEC(ZNODES(1,NNODES),14,ZRNOD2)
C SAVE THE BDLS PAGE AND BLOCK NAME
              CALL IMOVEC(ZNODES(15,NNODES),5,ZE(3))
C SET NET CONNECTION COUNT TO ZERO
              ZNODES(22,II)=0
              CALL ICVD(2,3,ZWORK(2))
              CALL EDITSO(ZOUT,210,ZWORK,ZWORK,I,J)
C SAVE THE BDLS PIN NAME
              IF(I.GT.0) CALL IMOVEC(ZNODES(20,NNODES),2,ZOUT(J-8))
              II=NNODES
C SUBSTITUTE THE BDLS NAME
1000          CALL IMOVEC(ZRNOD2,2,'PG')
              CALL IMOVEC(ZRNOD2(3),7,ZNODES(15,II))
              CALL ICVD(2,3,ZWORK(2))
C DO WIRING CONNECTION #2
              CALL EDITSO(ZOUT,210,ZWORK,ZWORK,K,L)
              IF(K.GT.0) GO TO 1010
                 WRITE(IPR,910) (ZWORK(K),K=1,4), ZOUT
                 GO TO 1030
1010          DO 1020 N=1,K
                 CALL EDITSO(ZOUT,210,ZWORK,ZWORK,M,L)
                 IF(M.EQ.0) GO TO 1030
                 CALL IMOVEC(ZOUT(L-5),9,ZRNOD2)
1020          CONTINUE
C INCREMENT THE NETNAME CONNECTION COUNT
              ZNODES(22,II)=ZNODES(22,II)+1
1030          CONTINUE
              WRITE(7,1040) ZOUT
1040          FORMAT(72A1)
              CALL IMOVEC(ZOUT,210,ZOUT2)
C ALL FULL BARS ARE DONE. CHECK FOR THE LAST BAR USED
1050          IF(KPART.EQ.0) GO TO 1060
C THE LAST BAR IS REQUIRED. GET ITS BLOCK NAME AND WIRING LIST
C   THEN GO UP AND WIRE IT
              CALL NXTBLK(ZE,ZP)
              CALL EDITSO(ZOUT,210,'PG001#E/',ZE,I,J)
              CALL EDITSO(ZOUT,210,'#PP/',ZP,I,J)
              CALL EDITSO(ZOUT,210,'#TI/','#TI/',I,J)
              IF(I.GT.0) CALL IMOVEC(ZOUT(J),20,ZCOMNT)
              CALL EDITSO(ZOUT,210,'R##/','R##/',L,M)
              CALL IMOVEC(ZOUT(M),3,ZBTRPT)
C ADD ALL PARALLEL SEGMENT'S NODE 1
              KPART=0
              GO TO 900
1060          CONTINUE
              RETURN
              END
```

Figure 38. Subroutine ROUTL (3 of 3).

```
      SUBROUTINE GL1GEN(KBARS,ZBARS,RVAL,ZBTR,IBTYE,NVAL,NWDTS,
     * NXBAR)
C TITLE/DESCRIPTION: CREATE GL1 RESISTORS FROM LOADED TABLES
      IMPLICIT INTEGER*2($), LOGICAL*1(Z)
      REAL ZBARS
      DIMENSION ZWORK(10), ZOVLY(16000),$PINA(5)
      DIMENSION $CRD(30),$N1(2), $LEVNM(5),ILINDX(5),$VAL(3)
      DIMENSION NXBAR(500),KBARS(50),ZBARS(65,65),RVAL(500)
      DIMENSION ZBTR(3,500),IBTYE(500)
      EQUIVALENCE ($N1(1),ORIEN)
      DATA $7411/Z7411/, $7001/Z7001/, $7424/Z7424/,$3112/Z3112/
      DATA $7214/Z7214/, $7324/Z7324/, $0001/Z0001/,$000A/Z000A/
      DATA $6111/Z6111/,$6112/Z6112/,$B/' '/
      DATA $100/Z100/, $6211/Z6211/,$0000/Z0000/,$200/Z200/
      DATA $F122/ZF122/, $F113/ZF113/,$1111/Z1111/,$3111/Z3111/
      DATA $PINA/'PB','PC','PD','PE','PF'/,ILINDX/27,7,13,23,61/
C
C ZBARS ARRAY: 1=BAR WIDTH.  2=CONTACT WIDTH.  3=CONTACT HEIGHT.
C    4=CONTACT TO BAR END SPACING. 5=CONTACT TO BAR SIDE SPACING
C    6=CONTACT TO CONTACT SPACING.   7,8=CONTACT LEVEL NAME.
C    9=UNUSED.   10-12=OHMS PER SQUARE.
C    13,14=METAL LEVEL NAME.  15=METAL OVLP ON SIDES OF CONTACT.
C    16=CORNER CORRECTION FACTOR FOR C- L- ZIGZAG BARS.
C    17=METAL OVERLAP ON ENDS OF CONTACT. 18=UNUSED.
C    19,20=DIFFUSION LEVEL NAME. 21,22=CELL NAME FOR CONTACT.
C    23,24=MIDDLE CONTACT LEVEL NAME.
C    25=MIDDLE CONTACT DELTA LENGTH.
C    26=MIDDLE CONTACT DELTA WIDTH.
C    27-28=CNL2 (RPORT). 29=CAP. 30=SUFFIX.
C    31=OVW2 (SIDE OVERLAP OF CNL2).
C    32=OVH2 (TOB/BOT OVERLAP OF CNL2)
C    33=LEVEL INDEX NUMBER OF CNL2 (RPORT)
C    34=LEVEL INDEX NUMBER OF CONTACT. 35=INDEX # OF METAL.
C    36=INDEX # OF MIDDLE CONTACT. 38=INPUT CONTACT LEVEL #.
C    37=INDEX LEVEL OF WIRE.
C    39=1.0 IF GROUNDRULE IS USED, 0 IF NOT.
C    40= .TRUE.=DEFINE CONTACT, .FALSE.= DO NOT.
C    41-43=ZIRCON CORRECTION FACTOR.
C    44-46=SNIPE/PANTHER/CHABLIS CORRECTION FACTOR.
C    47-50=UNUSED.
      $VAL(2)=$B
      STPNM = 1.000001*10
C START OF GL1 MESSAGE (NO OF WORDS,START,ORIENTATION STEP SIZE,
C                          NUMERATOR,DENOMINATOR)
      CALL WTWDS4($7001,$7214,$0001,$000A)
C LOAD THE RES CELLS REFERENCE
      DO 1070 II=1,NVAL
      CALL IMOVEC($VAL,3,ZBTR(1,II))
      $=II
      CALL WTWDS5($7411,$VAL,$VAL(2),'  ',$)
1070  CONTINUE
      DO 1080 I=1,50
      IF (ICLCC(ZBARS(21,I),4,0).LE.0) GO TO 1080
        CALL IMOVEC($LEVNM,8,ZBARS(21,I))
        $=I+NVAL
        CALL WTWDS4($7424,$LEVNM,$LEVNM(2),$LEVNM(3))
        CALL WTWDS2($LEVNM(4),$)
1080  CONTINUE
C CREATE CELL FOR PIN1
      CALL WTWDS5($7411,'RK','LL','  ',$100)
      CALL WTWDS5($7411,'PI','NR','  ',$200)
      LVL=0
C OUTPUT LEVEL NAMES. DO FOR "CNL2","CNLV","MLEV","MCLV","WLVL"
      DO 1130 JJ=1,5
```

Figure 39.  Subroutine GL1GEN (1 of 4).

```
              INDX=ILINDX(JJ)
              IND2=JJ+32
C SCAN ALL RULES FOR THIS NAME
              DO 1120 I=1,NWDTS
              IF(I.EQ.1) GO TO 1100
              N=I-1
                 DO 1090 J=1,N
C LOOK FOR THIS NAME IN ALL PREVIOUSLY-USED RULES
                 IF(ICLCC(ZBARS(INDX,J),8,ZBARS(INDX,I)))
     *                                                   1090,1110,1090
1090             CONTINUE
1100          CALL IMOVEC($LEVNM,8,ZBARS(INDX,I))
              IF($LEVNM(1).EQ.$B.OR.$LEVNM(1).EQ.0) GO TO 1120
              LVL=LVL+1
              $=LVL
              CALL WTWDS4($7324,$LEVNM,$LEVNM(2),$LEVNM(3))
              CALL WTWDS2($LEVNM(4),$)
1110          ZBARS(IND2,I)=LVL
1120          CONTINUE
1130       CONTINUE
C OUTPUT LEVEL NAME FOR PIN SHAPE
         CALL WTWDS6($7324,'PI','NR',' ',' ',$100)
C OUTPUT ALL CONTACT INFORMATION FOR REQUESTED CONTACT CELLS
         DO 1170 I=1,NWDTS
         $=I+NVAL
         CALL WTWDS2($6111,$)
C CONVERT ALL FLOATING-POINT NUMBERS TO GL/1 STEPS
              DO 1140 J=1,35
1140          KBARS(J)=ZBARS(J,I)*STPNM
C DO CNLV SHAPE
         K=ZBARS(34,I)
         $=K
         IF(K.EQ.0) GO TO 1150
              CALL WTWDS2($3112,$)
              CALL WTGLX(KBARS(15))
              CALL WTGLX(KBARS(17))
              CALL WTGLX(KBARS(2))
              CALL WTGLX(KBARS(3))
C DO CNL2 SHAPE
1150     K=ZBARS(33,I)
         IF(K.EQ.0) GO TO 1160
              $=K
              CALL WTWDS2($3112,$)
              CALL WTGLX(KBARS(15)-KBARS(31))
              CALL WTGLX(KBARS(17)-KBARS(32))
              CALL WTGLX(KBARS(2)+KBARS(31)+KBARS(31))
              CALL WTGLX(KBARS(3)+KBARS(32)+KBARS(32))
C DO METAL SHAPE
1160     L=ZBARS(35,I)
         $=L
         CALL WTWDS6($3112,$,0,0,0,0)
         CALL WTGLX(KBARS(2)+KBARS(15)+KBARS(15))
         CALL WTGLX(KBARS(3)+KBARS(17)+KBARS(17))
1170     CONTINUE
      CALL WTWDS2($6112,$100)
         DO 1180 I=1,NWDTS
         $=I+NVAL
         CALL WTWDS6($6211,$,$0000,$0000,$0000,$0000)
1180     CONTINUE
C CREATE PIN CELL
C     IXGRID AND IYGRID ARE IN GL1 STEPS
      CALL GETGRD(IXGRID,IYGRID,STPNM,KWIRE1,KWIRE2,IOVLP)
      IX=IXGRID-1
      IX2=(IX/2)*(-1)
```

Figure 40. Subroutine GL1GEN (2 of 4).

```
        IY=IYGRID-1
        IY2=(IY/2)*(-1)
        CALL WTWDS2($6111,$200)
        CALL WTWDS2($3112,$100)
        CALL WTGLX(IX2)
        CALL WTGLX(IY2)
        CALL WTGLX(IX)
        CALL WTGLX(IY)
        $=2
        CALL WTWDS4($F113,$,'PI','NR')
C CREATE CELLS WITH CORRECT DISTANCES
        DO 1250 I=1,NVAL
        $STEP=$ES
        R=RVAL(I)
        NCONT=NXBAR(I)
        IBT=IBTYE(I)
C SPECIFICATION IS IN OHMS. CONVERT TO DISTANCE
        FUDGE=ZBARS(44,IBT)/(ZBARS(1,IBT)-2.*ZBARS(5,IBT))
    *                   +ZBARS(41,IBT)/ZBARS(1,IBT)
        RL=(R-FUDGE)*ZBARS(1,IBT)/ZBARS(10,IBT)
        $=I
        CALL WTWDS2($6112,$)
C CALCULATE END SPACE(ES) AND SIDE SPACE(SS)
        $ES=ZBARS(4,IBT)*STPNM
        $SS=ZBARS(5,IBT)*STPNM
C PLACE FIRST CONTACT AND ADD PIN
        $=NVAL+IBT
        CALL WTWDS6($6211,$,0,0,$ES,$SS)
C PLACE PIN CELL CENTERED OVER CONTACT CELL
        $X=((ZBARS(2,IBT)+ZBARS(15,IBT)+ZBARS(15,IBT))/2.)
    *          *STPNM+($ES)
        $Y=((ZBARS(3,IBT)+ZBARS(17,IBT)+ZBARS(17,IBT))/2.)
    *          *STPNM+($SS)
        CALL WTWDS6($6211,$200,0,0,$X,$Y)
        $N=2
        CALL WTWDS4($F122,$N,'PA','1 ')
            DO 1240 NCN=1,NCONT
            $=NVAL+IBT
            IGRDST=$X
            KCON=ZBARS(2,IBT)*STPNM
            $X2=(RL*STPNM)+KCON+($STEP)
C CHECK RESISTOR CONTACT TO CONTACT SPACING
C PLACE SECOND CONTACT AND ADD PIN
            CALL WTWDS6($6211,$,0,0,$X2,$SS)
            $STEP=$X2
C (X) ADD DISTANCE TO CENTER OF CONTACT +
C RES DISTANCE TO ADD PIN CELL
            $XP=$X+$STEP-$ES
            $PIN=$PINA(NCN)
            CALL WTWDS6($6211,$200,0,0,$XP,$Y)
            CALL WTWDS4($F122,$N,$PIN,'1 ')
C COMPUTE THE DISTANCE TO THE CLOSEST GRID POINT
C DRAW A LINE TO IT IF IS TOO FAR
            IX=$XP
            IDISTO=9999
                DO 1200 J=1,10
                IDIST=(J*IXGRID)-IX+IGRDST
                IF (IDIST.GT.0) GO TO 1190
                    IDIST=IDIST*(-1)
1190            IF(IDIST.GE.IDISTO) GO TO 1210
                IDISTO=IDIST
1200            CONTINUE
1210        CONTINUE
C CHECK POTENTIAL LINE LENGTH
```

Figure 41. Subroutine GL1GEN (3 of 4).

```
C IF CONTACT TOUCHES PIN DON'T DRAW LINE
          KHGT=((ZBARS(3,IBT)+ZBARS(17,IBT)+ZBARS(17,IBT))
     *         *STPNM)
          KWTH=((ZBARS(2,IBT)+ZBARS(15,IBT)+ZBARS(15,IBT))
     *         *STPNM)
          KCHECK=((IDISTO-(KWTH/2))-(KWIRE1/2))+IOVLP
          IF(KCHECK.LE.0) GO TO 1240
C DRAW A LINE BETWEEN GRID PT AND RES CELL
C    GRID PT
          L=ZBARS(37,IBT)
          $=L
          $2=2
          J=J-1
          $DIST=(J*IXGRID)+IGRDST
C    RES CELL
          NDIST=$DIST
          IX=$XP
          IF(NDIST.LT.IX) GO TO 1220
              ISTRT=IX+(KWTH/2)-IOVLP
              GO TO 1230
1220      ISTRT=IX-(KWTH/2)+IOVLP
1230      $STRT=ISTRT
C LINE WIDTH = CONTACT HEIGHT
          $W=KHGT
          CALL WTWDS8($1111,$,$2,$STRT,$Y,$DIST,$Y,$W)
1240      CONTINUE
C ADD CCUST SHAPE
          K=ZBARS(36,IBT)
          IF(K.LE.0.OR.K.GT.5) GO TO 1250
          $=K
          $CX=$ES-(ZBARS(59,IBT)*STPNM)
          $CY=$SS-(ZBARS(60,IBT)*STPNM)
          $H=ZBARS(1,IBT)*STPNM
          $W=(((2*(ZBARS(59,IBT)+ZBARS(15,IBT)))+ZBARS(2,IBT))
     *         STPNM)+ ($STEP-$ES)
          CALL WTWDS6($3111,$,$CX,$CY,$W,$H)
1250      CONTINUE
C
          STOP
          END
```

Figure 42. Subroutine GL1GEN (4 of 4).

```fortran
      SUBROUTINE GETNO(NWDTS,KBARS,ZBARS)
C TITLE/DESCRIPTION: GET NUMBERS FOR RESISTOR EQTNS(LOAD ZBAR)
      IMPLICIT INTEGER*2($), REAL*8(Q)
      REAL ZBARS, MCDL, MCDW
      LOGICAL CONT/.FALSE./, TRUNC/.FALSE./
      DOUBLE PRECISION CNLV, MLEV, DFLV(2), CLNM, MCLV, CNL2,
     *   XLEV,ASTAP , RMAX, WLVL
      LOGICAL *1 ZOVLY(1500)
      NAMELIST /RES/ BARW, CONW, CONH, ESPC, SSPC, CCSP, CNLV,
     * OPSQ, ZCRF, SCRF, MLEV, OVPW, CRCF, OVPH, DFLV, CLNM,
     * MCLV, MCDL, MCDW, CNL2, CPSQ, TSUF, OVH2,OVW2,CONT,TRUNC,
     * ASTAP, BTR, THRESH, TOL, RMAX, CCUSY, CCUSX, WLVL
      DIMENSION INDATA(65),IX(4),OPSQ(3),ZCRF(3),SCRF(3)
      DIMENSION THRESH(2), KBARS(50), ZBARS(65,65)
      EQUIVALENCE (INDATA(01),BARW   ), (INDATA(19),DFLV(1))
      EQUIVALENCE (INDATA(02),CONW   ), (INDATA(23),MCLV   )
      EQUIVALENCE (INDATA(03),CONH   ), (INDATA(25),MCDL   )
      EQUIVALENCE (INDATA(04),ESPC   ), (INDATA(26),MCDW   )
      EQUIVALENCE (INDATA(05),SSPC   ), (INDATA(27),CNL2   )
      EQUIVALENCE (INDATA(06),CCSP   ), (INDATA(29),CPSQ   )
      EQUIVALENCE (INDATA(07),CNLV   ), (INDATA(30),TSUF   )
      EQUIVALENCE (INDATA(10),OPSQ(1)),(INDATA(31),OVW2    )
      EQUIVALENCE (INDATA(13),MLEV   ), (INDATA(32),OVH2   )
      EQUIVALENCE (INDATA(15),OVPW   ), (INDATA(40),CONT   )
      EQUIVALENCE (INDATA(16),CRCF   ), (INDATA(41),ZCRF(1))
      EQUIVALENCE (INDATA(17),OVPH   ), (INDATA(44),SCRF(1))
      EQUIVALENCE (INDATA(18),TRUNC  ), (INDATA(47),CLNM   )
      EQUIVALENCE (INDATA(49),ASTAP  ), (INDATA(51),BTR    )
      EQUIVALENCE (INDATA(53),THRESH(1)), (INDATA(55),TOL   )
      EQUIVALENCE (INDATA(57),RMAX   ), (INDATA(61),WLVL   )
      EQUIVALENCE (INDATA(59),CCUSX  ), (INDATA(60),CCUSY)
      DATA QB/' '/
      NWDTS=0
      REWIND 36
C SET ALL KEYWORDS TO 0.0; BLANKOUT DFLV(1:2)
      INDATA(1)=0
1260  CALL IMOVEC(INDATA(19),8,QB)
      CALL IMOVEC(INDATA(21),8,QB)
C GET THE NEXT NAMELIST RECORD
      READ(36,RES,END=1270)
      INDATA(18)=0
C IF DFLV(2) WAS BLANK, THEN SET IT = TO DFLV(1)
      IF(ICLCC(INDATA(21),8,QB).EQ.0)
     *                  CALL IMOVEC(INDATA(21),8,INDATA(19))
C IF DFLV WAS NOT SPECIFIED,
C   THEN RESTORE IT FROM PREVIOUS DFLV(1:2)
      IF(ICLCC(INDATA(19),8,QB).EQ.0)
     *                  CALL IMOVEC(INDATA(19),16,IX)
      NWDTS=NWDTS+1
      CALL IMOVEC(ZBARS(1,NWDTS),260,INDATA)
C IF RNEST, REPLACE DFLV(1) WITH DFLV(2)
C MOVE CLNM BACK WHERE IT BELONGS
      CALL IMOVEC(ZBARS(21,NWDTS),8,ZBARS(47,NWDTS))
C IF SECOND AND THIRD OPSQ, SCRF, ZCRF ARE ZERO,
C   SET THEM = TO FIRST VAL
      IF(ICLCC(ZBARS(12,NWDTS),4,0).EQ.0)
     *          CALL IMOVEC(ZBARS(11,NWDTS),8,ZBARS(10,NWDTS))
      IF(ICLCC(ZBARS(43,NWDTS),4,0).EQ.0)
     *          CALL IMOVEC(ZBARS(42,NWDTS),8,ZBARS(41,NWDTS))
      IF(ICLCC(ZBARS(46,NWDTS),4,0).EQ.0)
     *          CALL IMOVEC(ZBARS(45,NWDTS),8,ZBARS(44,NWDTS))
      GO TO 1260
1270  RETURN
      END
```

Figure 43.  Subroutine GETNO.

```fortran
      SUBROUTINE RESVL(ZBARS,ZCARD,ZBDLS,ZE,ZP,ZNVAL,KBARS,NMOD,
     *RVAL,ZBTR,IBTYE,ISET,KRULE,NBUSED,NWDTS,NXBAR)
C TITLE/DESCRIPTION: GET NUMBERS FOR RESISTOR VALUES
      IMPLICIT INTEGER*2($), REAL*8(Q), LOGICAL*1(Z)
      REAL ZBARS
      DIMENSION KBARS(50),RVAL(500),ZBTR(3,500),IBTYE(500),
      DIMENSION NXBAR(500),ZCARD(72), ZWORK(8),ZNUM(36),FULL(10)
      DIMENSION ZBTRPT(3), ZBTRFL(3),ZBDLS(216,200)
      DIMENSION ZE(8), ZP(4), ZB3(3), ZBARS(65,65),KNOSEG(16)
      COMMON IPR, IPAGE,NELEM,ZLASCM(20),ZOUT(210),ZSHEET(216),$
      COMMON ITHR1,ITHR2,ZCOMNT(20), NNODES,ZNODES(22,5000),NVAL
      DATA ZMNUS/'-'/, ZH/'H'/, Z2/'2'/, ZB3/' ',' ',' '/
      DATA ZNUM/'0','1','2','3','4','5','6','7','8','9','A','B',
     *'C','D','E','F','G','H','I','J','K','L','M','N','O','P',
     *'Q','R','S','T','U','V','W','X','Y','Z'/

C INITIALIZATION FOR ZBTR
      IF(ISET.EQ.1) GO TO 1280
          INUM=2
          KNUM=1
          ISET=1
          IBT=1
C INITAILIZE
1280  IHAVE=0
      NFULL=0
      NPART=0
      IVLFL=0
      IVLPT=0
      ISW=0
C CLEAR NOSEG
      DO 1290 N=1,16
1290     KNOSEG(N)=0
C
C BLANK OUT BTRS AND CALL RESISTOR VALUE
      CALL IMOVEC(ZBTRFL(1),3,ZB3)
      CALL IMOVEC(ZBTRPT(1),3,ZB3)
C SAVE THE REQUESTED RESISTANCE VALUE FROM THE ASTAP (XR)
      CALL IMOVEC(I,4,ZCARD(11))
C SAVE NUMBER OF PARALLELED BARS REQUESTED FROM ASTAP (XBARS)
      CALL IMOVEC(XBARS,4,ZCARD(19))
      IXBARS=XBARS
      IF(IXBARS.EQ.0) IXBARS=1
C IF PARALLELED BARS ARE REQUESTED IN ASTAP, MULTIPLY DESIRED
C VALUE BY THE NUMBER OF LEGS REQUESTED. THIS WILL BE VALUE OF
C EACH PARALLELED LEG.
      VALUE=I*IXBARS
      IVLPT=VALUE
C FIND THE CORRECT RESISTOR RULES (BAR TYPE)
      DO 1300 KK=1,NWDTS
          IF(ICLCC(ZCARD(2),6,ZBARS(49,KK)).EQ.0) GO TO 1320
1300     CONTINUE
      WRITE(IPR,1310) (ZCARD(K),K=2,7)
1310  FORMAT(' ERROR -- RESISTOR PARAMETERS (RCON CARD) FOR ',
     * 6A1,' WAS NOT FOUND IN OPTION FILE.')
      RETURN
1320  IBT=KK
C SET THE MAXIMUM RESISTOR VALUES FOR EACH VALUE
      CALL IMOVEC(FULLR,4,ZBARS(57,IBT))
C SET THE MINIMUM RESISTOR VALUES FOR EACH VALUE(1 SQ)
      CALL IMOVEC(OPSQ,4,ZBARS(10,IBT))
      FUDGE=ZBARS(44,IBT)/(ZBARS(1,IBT)-2.*ZBARS(5,IBT))
     *                        +ZBARS(41,IBT)/ZBARS(1,IBT)
      RSQ=OPSQ+FUDGE
      ITOL=IFIX(RSQ*100)
```

Figure 44. Subroutine RESVL (1 of 3).

```
C SEE IF BAR IS LESS THAN FULL BAR , IF BAR VALUE IS LESS THAN 0
C CALL RESSEG TO SET UP THE SEGMENTS
        IF(IVLPT.LT.0)
     *           CALL RESSEG(ZBARS,IVLPT,IXBARS,FULLR,IBT,KNOSEG)
        IF(IVLPT.GE.0) NCONT=1
        IF(IVLPT.GE.0) GO TO 1330
C
C DO ALL RESISTORS NEEDED FOR TOTAL VALUE
            DO 1530 ISEC=1,16
            IF(KNOSEG(ISEC).EQ.0) GO TO 1540
            NCONT=KNOSEG(ISEC)
            NPART=1
            ISW=1
            L=IVLPT
            GO TO 1370
C
1330    IF (IVLPT.LE.FULLR) GO TO 1340
        IVLPT=IVLPT-FULLR
        NFULL=NFULL+1
        IF(IVLPT.EQ.0) GO TO 1350
        GO TO 1330
C
1340    NPART=1
C SET THE VALUES FOR PART AND FULL BARS
1350    IF(NFULL.GE.1) IVLFL=FULLR
        IF(NFULL.EQ.0) ISW=1
1360    IF(ISW.EQ.0) L=IVLFL
        IF(ISW.EQ.1) L=IVLPT
1370    IF(NVAL.EQ.0) GO TO 1390
C CHECK TO SEE IF VALUE EXISTS ... CHECK TO SEE IF TYPE IS SAME
            DO 1380 M=1,NVAL
            IF(L.LT.0) L=L*(-1)
            IF (RVAL(M).EQ.L .AND. IBTYE(M).EQ.IBT .AND.
     *          NXBAR(M).EQ.NCONT) GO TO 1430
1380        CONTINUE
C IF RESISTOR DOESN'T ALREADY EXIST    ... CREATE BTR
1390    NVAL=NVAL+1
        RVAL(NVAL)=L
        IBTYE(NVAL)=IBT
        NXBAR(NVAL)=NCONT
        CALL IMOVEC(ZBTR(1,NVAL),1,'R')
        IF(INUM.NE.37) GO TO 1400
        INUM=1
        KNUM=KNUM+1
1400    CALL IMOVEC(ZBTR(2,NVAL),1,ZNUM(KNUM))
        CALL IMOVEC(ZBTR(3,NVAL),1,ZNUM(INUM))
C CHECK TO SEE IF RES IS LESS THAN 1 SQ
        IF(L.LT.0) L1=(-100)*L
        IF(L.GT.0) L1=L*100
        IF(ITOL.LT.L1) WRITE(2,1410) (ZBTR(M,NVAL),M=1,3),L,
     *  (ZBARS(KK,IBT),KK=49,50),NXBAR(NVAL)
        IF(ITOL.GE.L1) WRITE(2,1420) (ZBTR(M,NVAL),M=1,3),
     *               L,(ZBARS(KK,IBT),KK=49,50),NXBAR(NVAL)
C FIND WORD DEF OF IBT
        INUM=INUM+1
1410    FORMAT(1X,3A1,2X,I9,5X,2A4,I9)
1420    FORMAT(1X,3A1,2X,I9,5X,2A4,I9,
     *'  WARNING RESISTOR LESS THAN 1 SQ.')
1430    IF(ISW.NE.0) GO TO 1450
C    FIND BTR FOR FULL BAR
            DO 1440 K=1,NVAL
            IF (RVAL(K).EQ.L .AND. IBTYE(K).EQ.IBT .AND.
     *          NXBAR(K).EQ.NCONT) CALL IMOVEC(ZBTRFL,3,ZBTR(1,K))
1440        CONTINUE
```

Figure 45. Subroutine RESVL (2 of 3).

```
            IF(NPART.EQ.0) GO TO 1490
            ISW=1
            GO TO 1360
C     FIND BTR FOR PARTIAL BAR
1450        DO 1460 K=1,NVAL
            IF (RVAL(K).EQ.L .AND. IBTYE(K).EQ.IBT .AND.
     *      NXBAR(K).EQ.NCONT) CALL IMOVEC(ZBTRPT,3,ZBTR(1,K))
1460        CONTINUE
C  IF RESISTOR WAS MADE OF ONE BAR GET ANOTHER,
C  ELSE CHECK IF FULL BAR WAS CREATED
C
            DO 1470 KRULE=1,NMOD
            IF(ICLCC(ZCARD(2),5,ZBDLS(1,KRULE)).EQ.0) GO TO 1490
1470        CONTINUE
            WRITE(IPR,1480) ZBDLS(1,KRULE)
1480        FORMAT(' ERROR -- PROTOTYPE STATEMENT FOR RESISTOR ',
     *      'MODEL ',A8, ' WAS NOT FOUND.')
1490        CALL ROUTL(NFULL,NPART,ZBDLS(1,KRULE),ZE,ZP,ZCARD,
     *      IXBARS,NBUSED,ZBTRFL,ZBTRPT,KNOSEG,ISEC)
C CHANGE VALUE TO POSITIVE FOR EASY READ OUTPUT
            IRES=IVLPT
            IF(IXBARS.LT.0) IRES=(-1)*IRES
            IF(NFULL.GT.0) WRITE(IPR,1500) ZCOMNT,I,NFULL,FULLR,
     *      (ZBTRFL(L),L=1,3),IRES,(ZBTRPT(K),K=1,3)
            IF(NFULL.EQ.0) WRITE(IPR,1510) ZCOMNT,I,
     *      IRES,(ZBTRPT(K),K=1,3),IXBARS
1500        FORMAT(20A1,I6,4X,'(',I2,')   X ',F8.2,'(',3A1,')',
     *      '    +   ',I6,'(',3A1,')')
1510        FORMAT(20A1,I6,35X,
     *      I6,'(',3A1,') (',I3,')')
C FLAG RESISTORS LESS THAN 1 SQ
            IF((IRES*100).GT.ITOL) GO TO 1530
            WRITE(IPR,1520) (ZBTRPT(K),K=1,3)
1520        FORMAT('==>',3A1,' RESISTOR LESS THAN 1 SQ .... LOOK ',
     *      'AT THIS ONE  .... IS THIS WHAT YOU WANT?')
1530        CONTINUE
1540    RETURN
        END
```

Figure 46. Subroutine RESVL (3 of 3).

```
        SUBROUTINE GETGRD(IXGRID,IYGRID,STPNM,KWIRE1,KWIRE2,IOVLP)
C TITLE/DESCRIPTION: GET NUMBERS FOR GRIDS TO MAKE PIN CELL
        IMPLICIT INTEGER*2($), REAL*8(Q), LOGICAL*1(Z)
        NAMELIST /GRID/ XGRID,YGRID,WIRE1,WIRE2,WOVLP
C
C
C GET THE NEXT NAMELIST RECORD
        REWIND 36
1550    READ(36,GRID,END=1560)
C PUT THE DIMENSIONS (IXGRD,IYGRID) IN GL1 STEPS
        IXGRID=XGRID*STPNM
        IYGRID=YGRID*STPNM
        KWIRE1=WIRE1*STPNM
        KWIRE2=WIRE2*STPNM
        IOVLP=WOVLP*STPNM
        GO TO 1550
1560    RETURN
        END
```

Figure 47. Subroutine GETGRD.

```
      SUBROUTINE RESSEG(ZBARS,IVLPT,IXBARS,FULLR,IBT,KNOSEG)
C TITLE/DESCRIPTION: SET OF BARS FOR PARALEL SEGMNTS ON SAME BAR
      IMPLICIT INTEGER*2($), REAL*8(Q), LOGICAL*1(Z)
      REAL ZBARS
      DIMENSION KBARS(50),RVAL(500),ZBTR(3,500),IBTYE(500)
      DIMENSION ZCARD(72), ZWORK(8), ZNUM(36), FULL(10)
      DIMENSION ZBTRPT(3), ZBTRFL(3),ZBDLS(216,200)
      DIMENSION ZE(8), ZP(4), ZB3(3), ZBARS(65,65),KNOSEG(16)
      COMMON IPR,IPAGE,NELEM,ZLASCM(20),ZOUT(210),ZSHEET(216),$
      COMMON ITHR1,ITHR2,ZCOMNT(20),NNODES,ZNODES(22,5000),NVAL

ISW=0
      NMAX=4
      STPNM = 1.000001*10
C SET INITIAL PARAMETERS
      NVLPT=(-1)*IVLPT
      IR=FULLR
      NBARS=(-1)*IXBARS
C SET RESISTOR CONTACT VALUE
      NOPSQ=(ZBARS(10,IBT))*1
      ICONR=(ZBARS(2,IBT)/ZBARS(1,IBT))*NOPSQ
C FIND MAXIMUM NO. OF SEGMENTS THAT CAN BE PLACED ON A BAR
      NOBAR=0
1570     DO 1580 I=1,NBARS
         IF(NVLPT.GT.IR) GO TO 1600
         IR=IR-NVLPT-ICONR
         IF(IR.LT.NVLPT) GO TO 1590
         IF(I.EQ.NMAX) GO TO 1590
         IF(NBARS.EQ.I) GO TO 1590
1580     CONTINUE
1590  NBARS=NBARS-I
      GO TO 1630
C  WRITE ERROR MESSAGE - RESISTOR TOO LARGE FOR TWO ON SAME BAR
1600  WRITE(IPR,1610) ZCOMNT
1610  FORMAT(' ERROR - RESISTOR SEGMENTS TOO LARGE FOR BAR  ',
     * 20A1)
      WRITE(IPR,1620)
1620  FORMAT(' ****** USE POSITIVE VALUE ON XBAR ****** ')
      STOP
C   LOAD NOSEG WITH SEGMENT NO. PER BAR
1630  NOBAR=NOBAR+1
      KNOSEG(NOBAR)=I
      IR=FULLR
      I=0
C CHECK TO MAKE SURE NOT ONLY 1 SEGMENT IS PUT ON A BAR
      IF(NBARS.NE.0) GO TO 1570
      RETURN
      END
```

Figure 48.  Subroutine RESSEG.

```
      SUBROUTINE WTWDS2($I,$J)
      IMPLICIT INTEGER*2($), REAL*8(Q), LOGICAL*1(Z)
      WRITE(9,1640) $I,$J
1640  FORMAT(9A2)
      RETURN
      ENTRY WTWDS4($I,$J,$K,$L)
      WRITE(9,1640) $I,$J,$K,$L
      RETURN
      ENTRY WTWDS5($I,$J,$K,$L,$M)
      WRITE(9,1640) $I,$J,$K,$L,$M
      RETURN
      ENTRY WTWDS6($I,$J,$K,$L,$M,$N)
      WRITE(9,1640) $I,$J,$K,$L,$M,$N
      RETURN
      ENTRY WTWDS8($I,$J,$K,$L,$M,$N,$O,$P)
      WRITE(9,1640) $I,$J,$K,$L,$M,$N,$O,$P
      RETURN
      ENTRY WTGLX(I)
      WRITE(9,1650) I
1650  FORMAT(A4)
      RETURN
      END
```

Figure 49. Subroutine WTWDS#.

```
      SUBROUTINE IMOVEC(ZTO,NUMC,ZFROM)
      IMPLICIT INTEGER*2($), LOGICAL*1(Z), REAL*8(Q)
      DIMENSION ZTO(10), ZFROM(10)
C
      IF(NUMC.LE.0) RETURN
      DO 10 I=1,NUMC
10    ZTO(I)=ZFROM(I)
      RETURN
      END
```

Figure 50. Subroutine IMOVEC.

```
***********************************************************
* TITLE/DESCRIPTION: CONVERT INTEGER TO CHARACTER STRING
***********************************************************
ICVD      START 0
          SPACE 1
* THIS ROUTINE CONVERTS A FULLWORD INTEGER TO CHARACTER STRING
* OF DECIMAL NUMBERS.         K = ICVD(INTGR,NCHRS,IARAY)
* 'INTGR' IS A FULLWORD. 'NCHRS' IS THE NUMBER OF CHARACTERS
* DESIRED IN THE OUTPUT ARRAY. 'IARAY' IS THE OUTPUT ARRAY OF
* CHARACTERS (RIGHT JUSTIFIED). THE ACTUAL NUMBER OF CHARACTERS
* REQUIRED WILL BE RETURNED IN REGISTER 0 (VARIABLE 'K').
          SPACE 1
          USING *,15
          B     PSTART
          DC    C' ICVD 10/25/77'
PSTART    STM   2,5,28(13)
          L     2,0(1)      A(INTGR)
          L     3,4(1)      A(NCHRS)
          L     4,8(1)      A(IARAY)
          L     0,0(2)      INTGR
          CVD   0,WORK
          OI    WORK+7,X'0F'
          L     5,0(3)      # CHARS
          BCTR  5,0
          SLL   5,4
          LA    5,7(5)
          STC   5,*+5
          UNPK  0(1,4),WORK(8)    ** MODIFIED **
          LA    0,10        DETERMINE MAX # OF CHARS REQUIRED
          LM    4,5,WORK
LOOP      LR    2,4
          SRL   2,8
          LTR   2,2
          BNZ   DONE
          SLDL  4,4         CHECK NEXT CHARACTER
          BCT   0,LOOP
DONE      LM    2,5,28(13)
          BR    14
          SPACE 1
WORK      DS    D
          SPACE 1
          END
```

Figure 51. Subroutine ICVD.

```
*****************************************************************
* TITLE/DESCRIPTION: EXPAND A WORD INTO 2 OR MORE WORDS
*****************************************************************
EXPND     START  0
          USING  *,15
          B      PSTART
          DC     C' EXPND   2/28/80'
* EXPANDS ARG 1 INTO TWO OR MORE VARIABLES OF ARG 2
* IF ARGUMENT 3 IS SPECIFIED, IT IS THE NUMBER OF BITS TO BE
* PLACED IN EACH OUTPUT GROUP. IF UNSPECIFIED, DEFAULTS TO 8.
* ARGUMENTS 1 AND 2 ARE HALFWORDS, ARGUMENT 3 IS A FULLWORD
PSTART    STM    2,6,28(13)
          LM     2,4,0(1)          GET ADDRESSES OF ARGUMENTS
          LH     2,0(2)            GET SOURCE HALFWORD
          L      4,0(4)            GET BIT GROUP COUNT
          LTR    3,3               IS ARGUMENT 2 THE LAST SPECIFIED
          BNM    *+8 IF ARG 2 IS THE LAST, BIT 0 WILL BE ON
          LA     4,8               ARG 3 IS UNSPECIFIED-DEFAULT= 8
          LA     5,16              MAXIMUM NUMBER OF BITS TO MOVE
LOOP      N      2,=F'65535'       CLEAR OUT THE JUNK
          SLL    2,0(4)            IDENTIFY THE NEXT GROUP
          LR     6,2               MOVE DATA TO A WORK REGISTER
          SRL    6,16     RIGHT-JUSTIFY DATA
          STH    6,0(3)            SAVE THE DATA
          LA     3,2(3)            NEXT SINK ADDRESS
          SR     5,4               ARE WE DONE WITH 16 BITS YET?
          BP     LOOP              NO, DO SOME MORE
          LM     2,6,28(13) RETURN
          BR     14
          END
```

Figure 52.   Subroutine EXPND.

```
**************************************************************
* TITLE/DESCRIPTION: FIND AND CHANGE TEXT STRINGS IN A BUFFER
**************************************************************
EDITSO   START 0
         USING *,15
* CALL   EDITSO(IBUF,LRECL,$SRCH,$REPL,NUM,INDEX)
         STM   2,11,28(13)
         LM    2,5,0(1)
         L     11,20(1)
         LA    9,1         BYTE POSITION OF ''FOUND'' DATA, IF ANY
         L     3,0(3)      GET LRECL
         SR    10,10  # TIMES DATA WAS FOUND
         LA    8,0(3,2)    ENDING ADDRESS
         ST    8,ENDADDR
         LR    7,4              R4, R7 = ADDR OF SEARCH FIELD
         LR    6,3              R3, R6 = LRECL
LOOP1    CLI   0(4),C'/'   DETERMINE SIZE OF SEARCH FIELD
         BE    DONE1
         LA    4,1(4)
         BCT   6,LOOP1
DONE1    SR    4,7         R4=LENGTH OF SEARCH FIELD
         LR    7,5
         LR    6,3
LOOP2    CLI   0(5),C'/'   DETERMINE SIZE OF SEARCH FIELD
         BE    DONE2
         LA    5,1(5)
         BCT   6,LOOP2
DONE2    SR    5,7         R5=LENGTH OF REPLACE FIELD
         BCTR  4,0
         STC   4,CLC1+1    SEARCH FIELD SIZE-1
         STC   4,MVC1+1
         SR    3,4         DETERMINE NUMBER OF CLC'S TO PERFORM
         BM    NOLOOP
         LM    6,8,8(1)    6=SEARCH; 7=REPLACE
CLC1     CLC   0(1,2),0(6) COMPARE TO SEARCH FIELD
         BNE   NO
MVC1     MVC   0(1,2),0(7) IF MATCHED, FILL WITH REPLACE FIELD
         LTR   10,10
         BNZ   *+8
         ST    9,0(11)     SAVE LOCATION INDEX OF 'FOUND' DATA
         LA    10,1(10)    INCREASE ''FOUND'' COUNT
NO       LA    2,1(2)      NEXT BYTE IN RECORD
         LA    9,1(9)
         BCT   3,CLC1      DO ALL COMPARISONS
NOLOOP   ST    10,0(8)     RETURN ''FOUND'' COUNT
RETURN   LM    2,11,28(13)
         BR    14
ENDADDR  DS    A
         END
```

Figure 53.   Subroutine EDITSO.

```
****************************************************************
* TITLE/DESCRIPTION: COMPARE TWO DATA STRINGS
****************************************************************
ICLCC     START   0
          SPACE   1
* THIS SUBPROGRAM COMPARES TWO CHARACTER ARRAYS.
* ARGUMENT 1 IS COMPARED TO ARGUMENT 3. REGISTER 0 IS SET TO
* -1, 0, OR +1 DEPENDING UPON WHETHER THE STRING OF ARGUMENT 1
* IS LESS THAN, EQUAL TO, OR GREATER THAN STRING OF ARGUMENT 3.
* ARGUMENT 2 SPECIFIES THE NUMBER OF ** HALFWORDS ** TO MOVE
* AND MUST BE POSITIVE; IF ZERO OR NEGATIVE, REG 0 WILL BE 0
          SPACE   1
* CALLING EXAMP: IF(ICLCC(ICOMP,NBYTES,ICTO)) LESS,EQUAL,GREATER
          SPACE   1
          USING   *,15
          B       COMMON
          DC      C' ICLC    11/16/83'
COMMON    BALR    15,0
          USING   *,15
PSTART    STM     2,5,12(13)
          LM      2,4,0(1)        GET ADDR OF ICMP, NWDS, ICTO
          LH      5,0(3)          GET NUMBER OF HALFWORDS TO MOVE
          LTR     5,5             ZERO?
          BP      FIXUP
          LH      5,2(3)          GET NUMBER OF HALFWORDS TO MOVE
          LTR     5,5             ZERO?
          BNP     EQUAL
*
FIXUP     MVI     COMP+1,255
          LR      3,5
          SPACE   1
LOOP      LR      5,3             NUMBER OF BYTES LEFT TO COMPARE
          SH      3,H256          DECREMENT BY 256
          BNM     COMP            GO COMPARE 256 BYTES
          BCTR    5,0             SUBTRACT 1
          STC     5,COMP+1        LESS THAN 256 LEFT TO COMPARE
COMP      CLC     0(1,2),0(4)       ** COUNT MODIFIED **
          BH      HIGH
          BL      LOW
          LA      2,256(2)
          LA      4,256(4)
          LTR     3,3             ANY BYTES LEFT ?
          BP      LOOP
EQUAL     SR      0,0             ARRAYS ARE EQUAL; R0=0
RETURN    LM      2,5,12(13)      RETURN TO
          BR      14                CALLING PROGRAM
HIGH      LA      0,1             R0=+1
          B       RETURN
LOW       LH      0,M1            R0=-1
          B       RETURN
H256      DC      H'256'
M1        DC      H'-1'
          END
```

Figure 54.  Function ICLCC.

```
***************************************************************
* TITLE/DESCRIPTION: "AND" TWO HALFWORDS
***************************************************************
IAND      START 0
          USING *,15
          B     PSTART
          DC    C' IAND 2/01/78'
          SPACE 1
* THIS FUNCTION SUBPROGRAM WILL AND(OR) ARGUMENTS 1 AND 2
* AND PLACE THE RESULT IN REGISTER 0. ALL ARGUMENTS ARE
* ASSUMED TO BE HALFWORDS TO BE 1130 COMPATIBLE.
* CALLING SEQUENCE: K=IAND(I,J)    K=IOR(I,J)
          SPACE 1
PSTART    STM   2,3,12(13)
          L     2,0(1)          GET ADDR OF ARG 1
          LH    0,0(2)          GET ARG 1
          L     2,4(1)          GET ADDR OF ARG 2
          LH    3,0(2)          GET ARG 2
          NR    0,3             'AND' THE TWO, PLACE IN REG 0
          LM    2,3,12(13)
          BR    14              RETURN
          SPACE 1
          END
```

Figure 55. Function IAND.

```
      SUBROUTINE GETN(ZNODE, ZCARD,IPTR)
      IMPLICIT INTEGER*2($), LOGICAL*1(Z), REAL*8(Q)
      DIMENSION ZNODE(14), $B(7), ZDELIM(5), ZCARD(72)
      DATA $B/7*' ', ZDELIM/'(',')',' -',',',0/, ZB/' '/
C
C THIS SUBROUTINE EXTRACTS THE NEXT CONTIGUOUS STRING OF
C       UP TO 14 NON-BLANK CHARACTERS.
C
      I=0
      CALL IMOVEC(ZNODE,14,$B)
690      DO 700 J=1,5
         IF(IPTR.GE.72) RETURN
         IF(ZCARD(IPTR).EQ.ZDELIM(J)) RETURN
700      CONTINUE
C DELIMITER WAS NOT FOUND
      IPTR=IPTR+1
C IF 10 CHARACTERS WERE FOUND, DON'T ACCEPT ANY MORE
      IF(I.GE.14) GOTO 690
C IF A BLANK CHARACTER, IGNORE IT
      IF(ZCARD(IPTR-1).EQ.ZB) GOTO 690
      I=I+1
      ZNODE(I)=ZCARD(IPTR-1)
      GOTO 690
      END
```

Figure 56. Subroutine GETN.

```
      SUBROUTINE NXTBLK(ZE,ZP)
      IMPLICIT INTEGER*2($), LOGICAL*1(Z), REAL*8(Q)
      DIMENSION ZE(8), ZP(4)
      DIMENSION ZCHARS(26)
      COMMON IPR, IPAGE, NELEM, ZLASCM(60),ZOUT(210),ZSHEET(216)
      COMMON $, ITHR1, ITHR2,ZCOMNT(60), NNODES, ZNODES(22,5000)
      DATA ZCHARS/'A','B','C','D','E','F','G','H','I','J','K',
     *'L','M','N','O','P','Q','R','S','T','U','V','W','X','Y',
     *'Z'/, ZSL/'/'/, ZQUOT/''''/
C THIS SUBROUTINE WILL INCREMENT TO THE NEXT BDLS BLOCK NAME.
C THE ELEMENT NAME AND THE PRINT POSITION WILL BE INCREMENTED.
C IF OVER 676 ELEMENTS EXIST ON THE CURRENT PAGE, PAGE WILL BE
C INCREMENTED. THE BLOCK NAME WILL BE RESET TO AA AND A SHEET
C STATEMENT WILL BE CREATED IN THE BDLS
      IF(NELEM.LT.676) GOTO 1090
      NELEM=0
      IPAGE=IPAGE+1
C INSERT THE TITLE INTO THE NEW SHEET STATEMENT
      CALL IMOVEC(ZOUT,210,ZSHEET)
C ADD THE PAGE NUMBER
      CALL ICVD(IPAGE,3,ZE(3))
      ZSV=ZE(6)
      ZE(6)=ZSL
      CALL EDITSO(ZOUT,210,'PG###/',ZE,I,J)
      ZE(6)=ZSV
      CALL EDITSO(ZOUT,210,'#TI/','#TI/',I,J)
      IF(I.LE.0) GOTO 1050
C ADD UP TO 20 CHARACTERS OF TITLE OR UNTIL QUOTE IS FOUND
      DO 1040 I=1,20
      CALL IMOVEC(ZOUT(J),1,ZLASCM(I))
      J=J+1
      IF(ZOUT(J).EQ.ZQUOT) GOTO 1050
1040  CONTINUE
C ENSURE THAT EVERY "#" WAS REPLACED ON THIS CARD
1050  CALL EDITSO(ZOUT,210,'#/','#/',I,J)
      IF(I.NE.0) GOTO 1070
C THE BDLS CARD FOR THE SHEET STATEMENT IS GOOD; SAVE IT
      WRITE(9,1060) ZOUT
1060  FORMAT(72A1)
      GOTO 1090
1070  WRITE(IPR,1080) ZOUT
1080  FORMAT(' ERROR -- SUBSTITUTION ERROR ON THIS CARD:',/,
     * (72A1))
C INCREMENT THE ELEMENT NUMBER ON THIS BDLS SHEET
1090  NELEM=NELEM+1
      I=(NELEM-1)/26
      J=(NELEM-1)-I*26
C IF PAGE WAS ZERO, SET IT TO AT LEAST 1
      IPAGE=MAX0(1,IPAGE)
C BUILD THE CURRENT BLOCK NAME. HERE IS THE PAGE NUMBER
      CALL ICVD(IPAGE,3,ZE(3))
C BUILD THE CURRENT BLOCK NAME. HERE IS THE BLOCK NAME
      ZE(6)=ZCHARS(I+1)
      ZE(7)=ZCHARS(J+1)
C BUILD THE CURRENT PRINT POSITION.
      KELEM=NELEM+261
      I=KELEM/26
      J=KELEM-I*26
      CALL ICVD(I,2,ZP)
      ZP(3)=ZCHARS(J+1)
      WRITE(11,1100) (ZE(I),I=1,7), ZCOMNT
1100  FORMAT(2X,7A1,2X,60A1)
      RETURN
      END
```

Figure 57. Subroutine NXTBLK.

We claim:

1. A personalizable semiconductor chip for implementing analog electrical circuits, said analog electrical circuits being designed to produce at least one analog output from at least one analog input, said personalizable semiconductor chip comprising:

a pair of power buses extending in a first dimension for carrying different supply voltages and thereby establishing a direction of unidirectional current flow therebetween in a second dimension substantially perpendicular to said first dimension, each of said buses having a plurality of contacts therealong;

a column of circuit bricks for containing a plurality of personalized analog circuits, said column being disposed along said first dimension of said chip and lying entirely between the buses of said pair, each of said bricks being substantially longer in said second dimension than in said first dimension, and having multiple transistor devices and multiple resistor devices, each of said transistor devices and at least one of said resistor devices having at least three contacts, all of said device contacts of each of said bricks being disposed in a single straight line along said second dimension, said bricks being disposed contiguously side by side along said first dimension on said chip such that one of said contacts of each of said power buses lie along said single straight line of each of said bricks.

2. The chip of claim 1, further comprising:

a first plurality of conductors formed in a first wiring layer disposed above said bricks, each of said conductors extending in said second dimension and interconnecting predetermined ones of said contacts.

3. An analog circuit on a semiconductor chip, said analog circuit being designed to produce at least one analog output from at least one analog input, said analog circuit comprising:

a pair of power buses extending in a first dimension for carrying different supply voltages and thereby establishing a direction of unidirectional current flow therebetween in a second dimension substantially perpendicular to said first dimension, each of said buses having a plurality of contacts therealong;

a plurality of substantially identical circuit bricks arranged in a column disposed along said first dimension and lying between the buses of said pair;

wherein each of said circuit bricks comprises a plurality of transistor devices and a plurality of resistor devices, each of said transistor and resistor devices having a plurality of contacts disposed substantially in a single straight line along said second dimension;

a plurality of electrical connections connecting individual ones of said contacts to other ones of said contacts to form said analog circuit;

wherein the contacts of a first circuit brick are connected by a first set of said electrical connections, and the contacts of a second circuit brick are connected by a second set of said electrical connections, said first and second set of electrical connections being substantially different, whereby the analog performance characteristics of said first and second bricks are substantially different.

4. The analog circuit of claim 3, wherein each of said bricks comprises a resistor device having at least three contacts, and wherein said resistor device in said first circuit brick presents a different resistance to the analog circuit than said resistor device in said second circuit brick.

5. The analog circuit of claim 3, wherein each of said bricks comprises at least three transistor devices, at least two of said transistor devices being of a first polarity and at least one of said transistor devices being of an opposite polarity.

6. The chip of claim 2, further comprising:

a second plurality of conductors formed in a second wiring layer disposed above said bricks and interconnecting predetermined ones of said first plurality of conductors and said contacts.

* * * * *